(12) United States Patent
Kobayashi et al.

(10) Patent No.: US 12,084,379 B2
(45) Date of Patent: Sep. 10, 2024

(54) WATER-AND-OIL REPELLENT LAYER-ATTACHED SUBSTRATE, AND METHOD FOR MANUFACTURING SAME

(71) Applicant: AGC Inc., Tokyo (JP)

(72) Inventors: Daisuke Kobayashi, Tokyo (JP); Maemi Iwahashi, Tokyo (JP); Aichi Inoue, Tokyo (JP); Yoshihito Tokunaga, Tokyo (JP); Kenji Ishizeki, Tokyo (JP); Yusuke Tomiyori, Tokyo (JP)

(73) Assignee: AGC Inc., Tokyo (JP)

( * ) Notice: Subject to any disclaimer, the term of this patent is extended or adjusted under 35 U.S.C. 154(b) by 635 days.

(21) Appl. No.: 17/341,499

(22) Filed: Jun. 8, 2021

(65) Prior Publication Data

US 2021/0300817 A1  Sep. 30, 2021

Related U.S. Application Data

(63) Continuation of application No. PCT/JP2019/050412, filed on Dec. 23, 2019.

(30) Foreign Application Priority Data

Dec. 26, 2018  (JP) ................. 2018-242730

(51) Int. Cl.
| | | |
|---|---|---|
| C03C 17/42 | (2006.01) | |
| C03C 21/00 | (2006.01) | |
| C09D 1/00 | (2006.01) | |
| C09D 5/00 | (2006.01) | |
| C09D 171/02 | (2006.01) | |
| C23C 14/02 | (2006.01) | |
| C23C 14/10 | (2006.01) | |
| C23C 14/12 | (2006.01) | |
| C23C 14/24 | (2006.01) | |
| G02B 1/18 | (2015.01) | |

(52) U.S. Cl.
CPC ............ *C03C 17/42* (2013.01); *C03C 21/002* (2013.01); *C09D 1/00* (2013.01); *C09D 5/002* (2013.01); *C09D 171/02* (2013.01); *C23C 14/024* (2013.01); *C23C 14/10* (2013.01); *C23C 14/12* (2013.01); *C23C 14/24* (2013.01); *G02B 1/18* (2015.01); *C03C 2217/76* (2013.01); *C03C 2218/151* (2013.01); *C03C 2218/32* (2013.01)

(58) Field of Classification Search
None
See application file for complete search history.

(56) References Cited

U.S. PATENT DOCUMENTS 10,786,976 B2 * 9/2020 Zhou .................. B32B 27/285
2015/0315443 A1  11/2015 Takeda et al.

FOREIGN PATENT DOCUMENTS

| JP | 8-325037 A | 12/1996 |
|---|---|---|
| JP | 2000-203884 A | 7/2000 |
| JP | 2012-72272 A | 4/2012 |
| JP | 2014-218639 A | 11/2014 |
| WO | WO 2014/126064 A1 | 8/2014 |

OTHER PUBLICATIONS

International Search Report issued Mar. 10, 2020 in PCT/JP2019/050412, filed on Dec. 23, 2019, 2 pages.

* cited by examiner

*Primary Examiner* — Sheeba Ahmed
(74) *Attorney, Agent, or Firm* — Oblon, McClelland, Maier & Neustadt, L.L.P.

(57) ABSTRACT

A water/oil repellent layer-provided substrate including a substrate, an undercoat layer formed on a surface of the substrate, and a water/oil repellent layer formed on a surface of the undercoat layer in this order. The water/oil repellent layer contains a condensate of a fluorinated compound having a reactive silyl group, the undercoat layer contains an oxide containing silicon and contains no alkali metal nor aluminum, and the substrate includes silica glass containing an alkali metal and aluminum.

20 Claims, 2 Drawing Sheets

WATER-AND-OIL REPELLENT LAYER-ATTACHED SUBSTRATE, AND METHOD FOR MANUFACTURING SAME

TECHNICAL FIELD

The present invention relates to a water/oil repellent layer-provided substrate, and a method for producing it.

BACKGROUND ART

In order to impart to the surface of a substrate water/oil repellency, fingerprint stain removability, lubricity (smoothness when touched with a finger), etc., it has been known to form a water/oil repellent layer comprising a condensate of a fluorinated compound on the surface of the substrate by surface treatment using a fluorinated compound having a poly(oxyperfluoroalkylene) chain and a reactive silyl group.

Further, since the water/oil repellent layer is required to have abrasion resistance, in order to improve adhesion between the substrate and the water/oil repellent layer, an undercoat layer is formed between them. For example, a silicon oxide layer is formed by deposition between the substrate and the water/oil repellent layer (Patent Documents 1 and 2), or an undercoat layer comprising a (hydrolyzed) condensate of e.g. $Si(NCO)_4$ is formed between the substrate and the water/oil repellent layer (Patent Document 3).

PRIOR ART DOCUMENTS

Patent Documents

Patent Document 1: JP-A-2014-218639
Patent Document 2: JP-A-2012-72272
Patent Document 3: WO2014/126064

DISCLOSURE OF INVENTION

Technical Problem

With the silicon oxide layer or the undercoat layer disclosed in Patent Documents 1 to 3, the adhesion between the substrate and the water/oil repellent layer may be insufficient. The water/oil repellent layer is required to have more improved abrasion resistance, and thus further improvement in the adhesion between the substrate and the water/oil repellent layer is required.

Further, since such a water/oil repellent layer is used for an optical article, a touch panel (e.g. the side touched by fingers), etc., it is required to have long-lasting abrasion resistance, that is improved long-term reliability of abrasion resistance.

Under these circumstances, the object of the present invention is to provide a water/oil repellent layer-provided substrate having improved long-term reliability of abrasion resistance, and a method for producing it.

Solution to Problem

The present inventors have conducted extensive studies on the above object and as a result, have found that the above object is achieved by the following constructions.
[1] A water/oil repellent layer-provided substrate comprising a substrate, an undercoat layer formed on the surface of the substrate, and a water/oil repellent layer formed on the surface of the undercoat layer in this order,
wherein the water/oil repellent layer comprises a condensate of a fluorinated compound having a reactive silyl group,
the undercoat layer contains an oxide containing silicon and contains substantially no alkali metal nor aluminum,
the substrate comprises silica glass containing an alkali metal and aluminum, and
when the following (a), (b) and (c) are specified from a depth profile (measurement interval: 2.0 nm or shorter) obtained by X-ray photoelectron spectroscopy (XPS) by $C_{60}$ ion sputtering from the side of the surface of the water/oil repellent layer, taking the total concentration of fluorine, silicon, aluminum, the alkali metal element and oxygen as 100 at %, the alkali deficiency index determined by the following (c) is higher than 0.0;
provided that the depth indicated by the horizontal axis of the depth profile is a depth calculated from the sputtering rate of a thermally oxidized film ($SiO_2$ film) having a known thickness on a silicon wafer:
(a): in the depth profile taking the total concentration of fluorine, silicon, aluminum, the alkali metal element and oxygen as 100 at %, obtained by XPS, the point at which the fluorine concentration becomes 10 at % or lower for the first time is taken as the boundary between the water/oil repellent layer and the undercoat layer;
(b): in the depth profile taking the total concentration of fluorine, silicon, aluminum, the alkali metal element and oxygen as 100 at %, obtained by XPS, the proportion of aluminum to silicon (Al/Si) and the total proportion of the alkali metal element to silicon (alkali metal element/Si) are obtained, and based on the average values of the values of (Al/Si) and the values of (alkali metal element/Si) in a region at a depth of at least 70.0 nm and at most 80.0 nm respectively being 1, the (Al/Si) and (alkali metal element/Si) at the respective positions in the depth direction are respectively normalized, and the point at which the normalized (Al/Si) value becomes 0.50 or higher for the first time is taken as the boundary between the undercoat layer and the substrate;
(c): the region from the boundary between the undercoat layer and the substrate determined by (b) as the origin up to 20 nm in the depth direction from the origin is taken as the region X, and the alkali deficiency index in the region X defined by the following formula is obtained:

alkali deficiency index=[(average value of normalized Al/Si in the region X)−(average value of normalized alkali metal element/Si in the region X)]×20.

[2] The water/oil repellent layer-provided substrate according to [1], wherein the alkali deficiency index is higher than 0.5.
[3] The water/oil repellent layer-provided substrate according to [1] or [2], wherein the substrate is made of chemically tempered glass having chemical tempering treatment applied to at least one principal plane, and the undercoat layer is formed on the principal plane having chemical tempering treatment applied thereto.
[4] The water/oil repellent layer-provided substrate according to any one of [1] to [3], wherein the average fluorine concentration which is the average value of the fluorine concentrations in the water/oil repellent layer specified by (a) is at least 15 at %.

[5] The water/oil repellent layer-provided substrate according to any one of [1] to [4], wherein the thickness of the undercoat layer specified by (a) and (b) is from 1.0 to 45.0 nm.

[6] The water/oil repellent layer-provided substrate according to any one of [1] to [5], wherein the thickness of the undercoat layer specified by (a) and (b) is from 7.0 to 25.0 nm.

[7] The water/oil repellent layer-provided substrate according to any one of [1] to [6], wherein the thickness of the substrate is from 0.1 to 1.5 mm.

[8] The water/oil repellent layer-provided substrate according to any one of [1] to [7], wherein the fluorinated compound is a fluorinated compound having two or more reactive silyl groups.

[9] The water/oil repellent layer-provided substrate according to any one of [1] to [8], wherein the fluorinated compound is a fluorinated ether compound having a poly(oxyfluoroalkylene) chain and a reactive silyl group.

[10] The water/oil repellent layer-provided substrate according to [9], wherein the poly(oxyfluoroalkylene) chain is a poly(oxyfluoroalkylene) chain composed mainly of oxyperfluoroalkylene groups.

[11] A method for producing the water/oil repellent layer-provided substrate as defined in any one of [1] to [10], which comprises forming, on the surface of the substrate, the undercoat layer containing an oxide containing silicon and an alkali metal,
forming, on the surface of the undercoat layer, the water/oil repellent layer comprising a condensate of a fluorinated compound having a reactive silyl group, and
subjecting the water/oil repellent layer-formed side to an aqueous medium treatment.

[12] The method for producing the water/oil repellent layer-provided substrate according to [11], wherein the aqueous medium treatment is washing treatment with an aqueous acid solution or dipping treatment in an aqueous acid solution.

Advantageous Effects of Invention

According to the present invention, it is possible to provide a water/oil repellent layer-provided substrate having improved long-term reliability of abrasion resistance, and a method for producing it.

DESCRIPTION OF EMBODIMENTS

In this specification, the units represented by the formula (1) will be referred to as "units (1)". The same applies to units represented by other formulae. The group represented by the formula (2) will be referred to as "group (2)". The same applies to groups represented by other formulae. The compound represented by the formula (3) will be referred to as "compound (3)". The same applies to compounds represented by other formulae.

In this specification, the wording "the alkylene group may have a group A" means that the alkylene group may have the group A between carbon-carbon atoms of the alkylene group, or may have the group A at the terminal, i.e. the alkylene group-group A-.

Meanings of the following terms in this specification are as follows.

A "bivalent organopolysiloxane residue" is a group represented by the following formula. $R^x$ in the following formula is an alkyl group (preferably $C_{1-10}$) or a phenyl group. g1 is an integer of at least 1, preferably an integer of from 1 to 9, particularly preferably from 1 to 4.

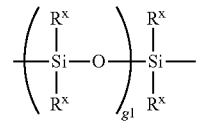

A "silphenylene skeleton group" is a group represented by $-Si(R^y)_2PhSi(R^y)_2-$ (wherein Ph is a phenylene group, and $R^y$ is a monovalent organic group). $R^y$ is preferably an alkyl group (preferably $C_{1-10}$).

A "dialkylsilylene group" is a group represented by $-Si(R^z)_2-$ (wherein $R^z$ is an alkyl group (preferably $C_{1-10}$)).

The "number average molecular weight" of a compound is calculated by obtaining the number (average value) of oxyfluoroalkylene groups on the basis of the terminal group, by $^1$H-NMR and $^{19}$F-NMR.

Figure 1:
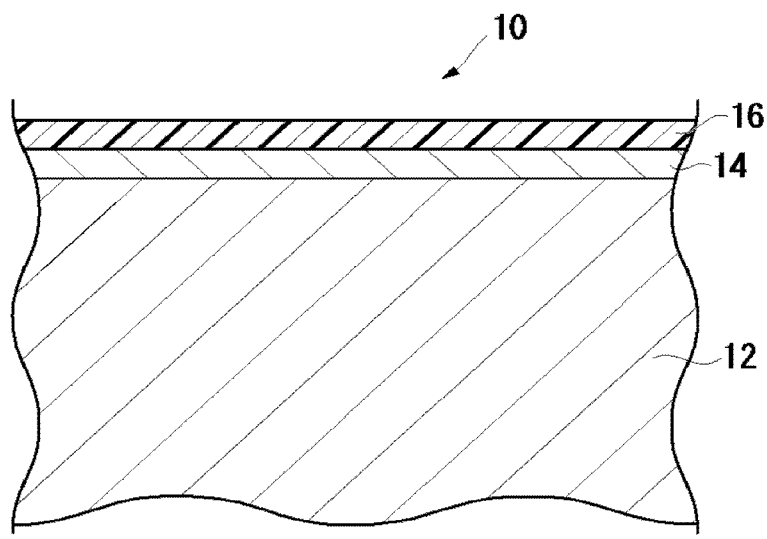
FIG. 1 is a cross sectional view schematically illustrating an example of a water/oil repellent layer-provided substrate of the present invention.

The dimensional ratio in FIG. 1 is different from actual one for explanatory convenience.

FIG. 1 is a cross sectional view schematically illustrating an example of a water/oil repellent layer-provided substrate of the present invention. The water/oil repellent layer-provided substrate 10 comprises a substrate 12, an undercoat layer 14 formed on one surface of the substrate 12 and a water/oil repellent layer 16 formed on the surface of the undercoat layer 14, in this order.

In the example shown in FIG. 1, the undercoat layer 14 and the water/oil repellent layer 16 are formed only on one surface of the substrate 12, but the structure is not limited thereto, and the undercoat layer 14 and the water/oil repellent layer 16 may be formed on both surfaces of the substrate 12.

The substrate 12 comprises silica glass containing an alkali metal and aluminum. The undercoat layer 14 contains an oxide containing silicon and contains substantially no alkali metal nor aluminum. The water/oil repellent layer 16 comprises a condensate of a fluorinated compound having a reactive silyl group.

The details of the substrate 12, the undercoat layer 14 and the water/oil repellent layer 16 will be described hereinafter.

The water/oil repellent layer-provided substrate of the present invention is such that the depth profile obtained by X-ray photoelectron spectroscopy (XPS) by $C_{60}$ ion sputtering from the side of the surface of the water/oil repellent layer, taking the total concentration of fluorine, silicon, aluminum, the alkali metal element and oxygen as 100 at % (100 atomic %), satisfies the following conditions. In a case where the substrate of the present invention is a chemically tempered glass substrate, the alkali metal element may be limited to alkali metal elements other than lithium. Lithium is an alkali metal element having a smallest ionic radius, and even of a glass substrate containing lithium, the surface layer after the chemical tempering treatment contains an alkali metal element other than lithium as the main alkali metal element. Further, in a case where the substrate of the present invention is a glass substrate containing substantially no rubidium nor cesium and being chemically tempered with a molten salt containing sodium or potassium, the alkali metal element may be limited to sodium and potassium.

The reason why $C_{60}$ ion sputtering is employed is to obtain an accurate depth profile with respect to the alkali metal element.

The depth indicated by the horizontal axis of the depth profile is given by the sputtering time. To convert the sputtering time to the depth, the sputtering rate is necessary. In the present invention, the sputtering rate of a thermally oxidized film ($SiO_2$ film) having a known thickness on a silicon wafer is preliminarily obtained, and the depth calculated as the thermally oxidized film on a Si wafer obtained from the sputtering rate is taken as the horizontal axis of the depth profile.

The measurement interval of the depth profile is 2.0 nm or shorter as the depth calculated as the thermally oxidized film ($SiO_2$ film) on a silicon wafer.

Figure 2:
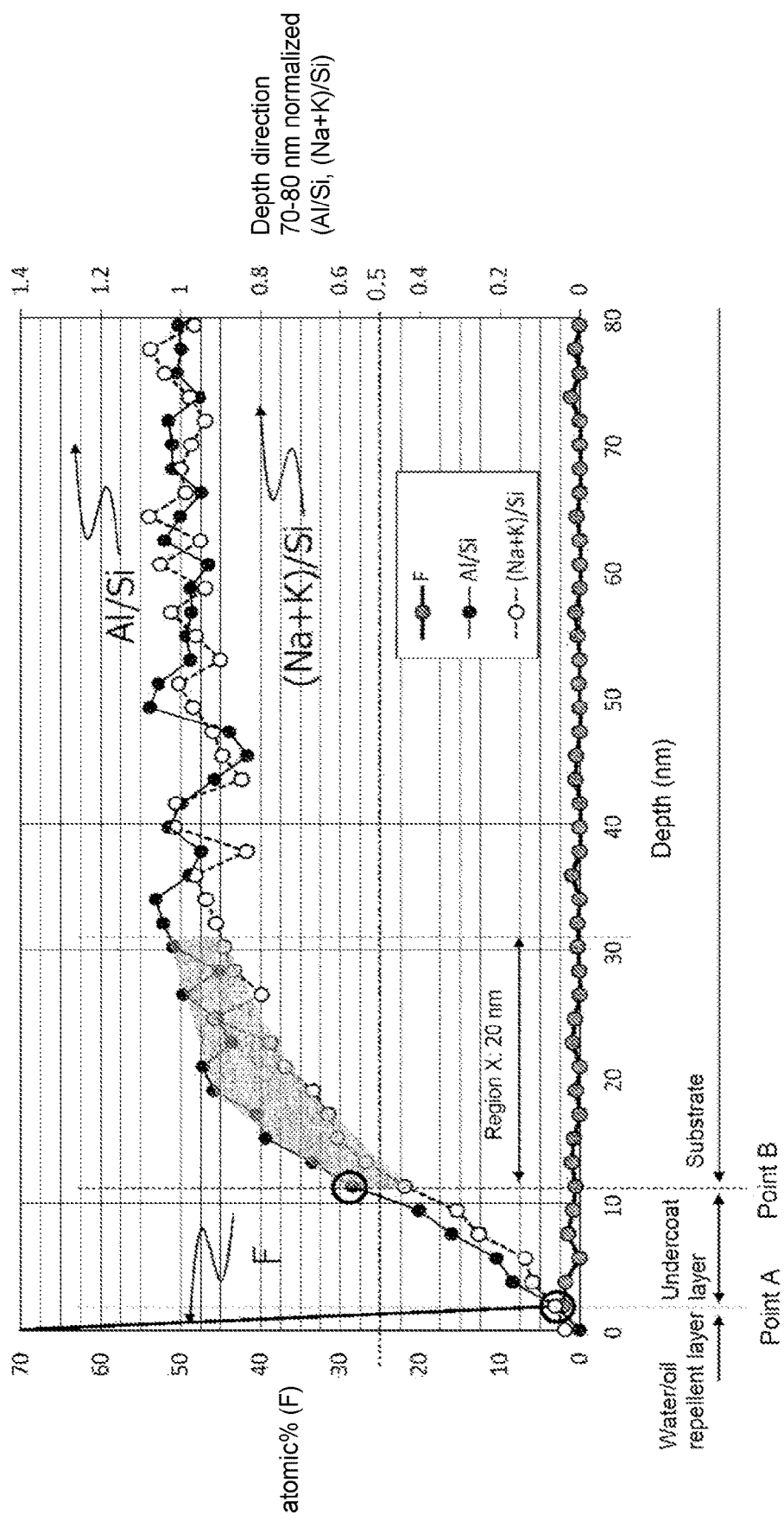
FIG. 2 is a view illustrating an example of procedure to calculate the alkali deficiency index in the present invention.

From the prepared depth profile, the following (a), (b) and (c) are specified. This procedure will be described with reference to FIG. 2. In FIG. 2, "at %" is represented as "atomic %".

FIG. 2 illustrates the depth profile of fluorine (F) among depth profiles obtained by XPS, taking the total concentration of fluorine, silicon, aluminum, sodium, potassium and oxygen as 100 at %, with respect to a water/oil repellent layer-provided substrate using as the substrate aluminosilicate glass containing an alkali metal element, chemically tempered with a molten salt of potassium nitrate (manufactured by AGC Inc., Dragontrail (registered trademark)), and the proportion of aluminum to silicon (Al/Si) and the total proportion of sodium and potassium to silicon ((Na+K)/Si) determined from the depth profile. In the water/oil repellent layer-provided substrate, the alkali metal element may be limited to sodium and potassium.

(a) In the depth profile taking the total concentration of fluorine, silicon, aluminum, sodium, potassium and oxygen as 100 at %, prepared by XPS, the point (the point A in FIG. 2) at which the fluorine concentration becomes 10 at % or lower for the first time is taken as the boundary between the water/oil repellent layer and the undercoat layer. That is, the depth from the surface of the water/oil repellent layer to the point A corresponds to the thickness of the water/oil repellent layer.

(b) In the depth profile taking the total concentration of fluorine, silicon, aluminum, sodium, potassium and oxygen as 100 at %, prepared by XPS, the proportion of aluminum to silicon (Al/Si) and the total proportion of sodium and potassium to silicon ((Na+K)/Si) are determined, and based on the average values of the values of (Al/Si) and the values of ((Na+K)/Si) in a region at a depth of at least 70.0 nm and at most 80.0 nm respectively being 1, the (Al/Si) and ((Na+K)/Si) at the respective positions in the depth direction are respectively normalized. In FIG. 2, based on the average values of the values of (Al/Si) and the values of ((Na+K)/Si) in a region at a depth of at least 70.0 nm and at most 80.0 nm being 1, the normalized (Al/Si) and ((Na+K)/Si) values at the respective positions in the depth direction are shown.

The point (the point B in FIG. 2) at which the normalized (Al/Si) value becomes 0.50 or higher for the first time is taken as the boundary between the undercoat layer and the substrate. That is, the depth from the point A to the point B corresponds to the thickness of the undercoat layer.

In a case where the depth from the point A to the point B is estimated to be more than 0.0 nm and at most 2.0 nm, the measurement interval of the depth profile is set to be preferably 1.0 nm or shorter as the depth calculated as the thermally oxidized film ($SiO_2$ film) on a silicon wafer.

(c) The region from the boundary between the undercoat layer and the substrate determined by (b) as the origin up to 20 nm in the depth direction from the origin is taken as the region X, and the alkali deficiency index in the region X defined by the following formula is obtained:

alkali deficiency index=[(average value of normalized Al/Si in the region X)−(average value of normalized(Na+K)/Si in the region X)]×20.

In FIG. 2, the position indicated by the gray tone corresponds to the alkali deficiency index. 20 in the above formula is introduced as a value (unit: nm) to indicate the depth of the region X, so that the position indicated by the gray tone corresponds to the alkali deficiency index.

The water/oil repellent layer-provided substrate of the present invention is such that the alkali deficiency index determined by the above (c) is higher than 0.0, preferably higher than 0.5, more preferably higher than 1.0, whereby the long-term reliability of abrasion resistance of the water/oil repellent layer will improve. The upper limit of the alkali deficiency index is not particularly limited and is preferably at most 18, more preferably at most 15.

The present inventors estimate the reason why the long-term reliability of abrasion resistance of the water/oil repellent layer improves when the alkali deficiency is higher than 0.0, as follows.

In order that the long-term reliability of abrasion resistance of the water/oil repellent layer improves, peeling of the water/oil repellent layer from the undercoat layer should be suppressed. To suppress peeling of the water/oil repellent layer from the undercoat layer, the undercoat layer in the present invention contains substantially no alkali metal. If an alkali metal is present in the surface of the undercoat layer, it reacts with moisture in the atmosphere to form alkali metal ions and hydroxide ions. The hydroxide ions cleave the Si—O—Si bond at the interface between the water/oil repellent layer and the undercoat layer, whereby the water/oil repellent layer is peeled from the undercoat layer. However, it is considered that by long-term use, particularly long-time use in a high temperature high humidity environment, the alkali metal contained in the substrate undergoes ion exchange reaction with hydrogen contained in the undercoat layer and migrates to the undercoat layer. If such an alkali metal is exposed to the surface of the undercoat layer, it reacts with moisture in the atmosphere to form alkali metal ions and hydroxide ions. It is considered that the hydroxide ions cleave the Si—O—Si bond at the interface between the water/oil repellent layer and the undercoat layer, and the water/oil repellent layer is peeled from the undercoat layer.

When the alkali deficiency index is higher than 0.0, the region in the vicinity of the surface up to 20 nm in the depth direction from the boundary between the undercoat layer and the substrate, lacks the alkali metal as compared with the interior of the substrate. Thus, migration of the alkali metal from the substrate to the undercoat layer is suppressed. As a result, it is considered that peeling of the water/oil repellent layer by the above mechanism is suppressed, and the long-term reliability of abrasion resistance of the water/oil repellent layer improves.

Now, the water/oil repellent layer-provided substrate of the present invention will be described in further detail.
(Substrate)

The substrate comprises silica glass containing an alkali metal and aluminum. The alkali metal may, for example, be lithium, sodium or potassium. The contents of the respective components in the substrate are preferably within the following ranges, in a case where a chemical tempering treatment is applied. Other components may be contained so long as the following composition ranges are satisfied.

$SiO_2$: 55 to 75 mol %

$Al_2O_3$: 0.5 to 20 mol %

Total concentration of $Li_2O$, $Na_2O$ and $K_2O$: 5 to 25 mol %

The above contents of the respective components are represented by mol % based on oxides.

The glass constituting the substrate may, for example, be soda lime glass or aluminosilicate glass.

As the substrate, a substrate for a touch panel or a substrate for a display is preferred, and a substrate for a touch panel is particularly preferred. The substrate for a touch panel preferably has translucency. "Having translucency" means that the normal incidence visible light transmittance in accordance with JIS R3106: 1998 (ISO9050: 1990) is at least 25%.

Further, as the substrate, the following examples may be mentioned. A building material, a decorative building material, an interior article, a transport equipment (such as an automobile), an advertising display/sign-board, tableware, an aquarium, a decorative device (such as a frame or a box), laboratory ware, furniture, a glass product to be used for art/sports/game. A glass product to be used for an exterior portion (excluding the display portion) of a device such as a mobile phone (such as a smartphone), a personal digital assistant, a gaming machine or a remote controller.

The substrate used for the above application is preferably chemically tempered glass having chemical tempering treatment applied to at least one principal plane. In such a case, the undercoat layer is formed preferably on the principal plane having the chemical tempering treatment applied thereto. The chemically tempered glass preferably have chemical tempering treatment applied to both the two facing principal planes.

As an industrially widely employed chemical tempering treatment, an ion exchange method of dipping glass in a molten salt at the glass transition point or below may be mentioned. This is a method of exchanging alkali ions in the interior of the glass with alkali ions having a larger ionic radius, whereby the compression stress forms on the surface by the difference in the ionic radius. For example, ion exchange of lithium ions in the interior of glass with sodium ions in a molten salt, or ion exchange of sodium ions in the interior of glass and potassium ions in a molten salt may, for example, be mentioned. A method of conducting such ion exchange treatments sequentially or simultaneously may also be employed.

The thickness of the substrate is preferably at least 0.1 mm and at most 1.5 mm from the viewpoint of strength and weight saving, more preferably at least 0.3 mm and at most 1.2 mm, further preferably at least 0.4 mm and at most 0.9 mm.

(Undercoat Layer)

As described above, the oxide containing silicon contained in the undercoat layer contains substantially no alkali metal. In this specification, "containing substantially no alkali metal" means that the total content of the alkali metal element in the undercoat layer, determined by the depth profile taking the total concentration of fluorine, silicon, aluminum, the alkali metal element and oxygen as 100 at %, obtained by XPS, more specifically, the average value of the total concentrations of the alkali metal element in the depth profile from the point A to the point B determined by the above (a) and (b), is at most 5.0 at %. The total content of the alkali metal element in the undercoat layer is preferably at most 4.0 at %, more preferably at most 3.0 at %. The lower limit is 0.0 at %.

The oxide containing silicon contained in the undercoat layer contains substantially no aluminum. In this specification, containing substantially no aluminum means as follows. From the depth profile taking the total concentration of fluorine, silicon, aluminum, the alkali metal element and oxygen as 100 at %, obtained by XPS, the proportion of aluminum to silicon (Al/Si) is determined, and based on the average value of the values of (Al/Si) in a region at a depth of at least 70.0 nm and at most 80.0 nm being 1, the (Al/Si) values at the respective positions in the depth direction are normalized to obtain a depth profile, and the normalized value of (Al/Si) in the undercoat layer obtained from the depth profile, more specifically, the average value of normalized (Al/Si) values in the depth profile from the point A to the point B determined by the above (a) and (b), is less than 0.50. The normalized value of (Al/Si) in the undercoat layer is preferably at most 0.40, more preferably at most 0.3 nm. The lower limit is 0.00.

The content of the oxide containing silicon in the undercoat layer is, to the total mass of the undercoat layer, in that the water/oil repellent layer will be more excellent in abrasion resistance, preferably at least 80 mass %, more preferably at least 95 mass %, particularly preferably 100 mass % (the undercoat layer is entirely formed of the oxide).

The oxygen concentration in the undercoat layer is determined by the depth profile taking the total concentration of fluorine, silicon, aluminum, the alkali metal element and oxygen as 100 at %, obtained by XPS. More specifically, the region from the point A to the point B determined by the above (a) and (b), in the depth profile taking the total concentration of fluorine, silicon, aluminum, the alkali metal element and oxygen as 100 at %, obtained by XPS, is applied to a depth profile taking the total concentration of all the elements contained in the undercoat layer as 100 at % obtained by XPS, and the average value of the oxygen concentrations in a region from the point A to the point B is calculated and taken as the oxygen concentration. The oxygen concentration in the undercoat layer is, in that the water/oil repellent layer will be more excellent in abrasion resistance, preferably from 40 to 70 at %, more preferably from 50 to 70 at %, particularly preferably from 60 to 70 at %.

The silicon concentration in the undercoat layer is determined by the depth profile taking the total concentration of fluorine, silicon, aluminum, the alkali metal element and oxygen as 100 at %, obtained by XPS. More specifically, the region from the point A to the point B determined by the above (a) and (b), in the depth profile taking the total concentration of fluorine, silicon, aluminum, the alkali metal element and oxygen as 100 at %, obtained by XPS, is applied to a depth profile taking the total concentration of all the elements contained in the undercoat layer as 100 at % obtained by XPS, and the average value of the silicon concentrations in a region from the point A to the point B is calculated and taken as the silicon concentration. The silicon concentration in the undercoat layer is, in that the water/oil repellent layer will be more excellent in abrasion resistance, preferably from 15 to 40 at %, more preferably from 20 to 40 at %, particularly preferably from 25 to 35 at %.

The thickness of the undercoat layer obtained as the depth from the point A to the point B, by the above (a) and (b), is preferably from 1.0 to 45.0 nm, more preferably from 3.0 to 35.0 nm, particularly preferably from 7.0 to 25.0 nm. When the thickness of the undercoat layer is at least the above lower limit value, the adhesion of the water/oil repellent layer by the undercoat layer will more improve, and the water/oil repellent layer will be more excellent in abrasion resistance. When the thickness of the undercoat layer is at most the above upper limit value, the undercoat layer itself will be excellent in abrasion resistance. The undercoat layer may have a composition distribution (concentration distribution) or may have irregularities, within the above range.

(Water/Oil Repellent Layer)

As described above, the water/oil repellent layer comprises a condensate of a fluorinated compound having a reactive silyl group. The reactive silyl group means a hydrolysable silyl group and a silanol group (Si—OH). As a specific example of the hydrolysable silyl group, a group represented by the after-described formula (2) wherein L is a hydrolysable group may be mentioned.

The hydrolysable silyl group becomes a silanol group represented by Si—OH by being hydrolyzed. The silanol groups further undergo dehydration condensation reaction to form a Si—O—Si bond. The silanol group undergoes dehydration condensation reaction with a silanol group derived from the oxide contained in the undercoat layer to form a Si—O—Si bond. That is, in a case where at least a part of the reactive silyl groups are hydrolysable silyl groups, the water/oil repellent layer contains a condensate having the reactive silyl groups of the fluorinated compound being hydrolyzed and subjected to dehydration condensation reaction. In a case where all the reactive silyl groups are silanol groups, the water/oil repellent layer contains a condensate having silanol groups of the fluorinated compound subjected to dehydration condensation reaction. The reactive silyl groups of the fluorinated compound are preferably such that at least a part thereof are hydrolysable silyl groups.

The thickness of the water/oil repellent layer, determined as the depth from the water/oil repellent layer surface to the point A by the above (a), is preferably at most 5.0 nm, particularly preferably at most 2.0 nm. When the thickness of the water/oil repellent layer is at least the lower limit value, effects by the water/oil repellent layer will be sufficiently obtained. When the thickness of the water/oil repellent layer is at most the above upper limit value, high utilization efficiency will be obtained. The thickness of the water/oil repellent layer is thicker than 0 nm.

In the water/oil repellent layer, the average fluorine concentration specified as the average value of the fluorine concentrations in the water/oil repellent layer by the above (a), is preferably at least 15 at % in that sufficient effects by the water/oil repellent layer will be obtained, and is more preferably at least 25 at %, particularly preferably at least 35 at %.

<Fluorinated Compound Having Reactive Silyl Group>

The fluorinated compound having a reactive silyl group is, in that the water/oil repellent layer will be excellent in water/oil repellency, preferably a fluorinated ether compound having a poly(oxyfluoroalkylene) chain and a reactive silyl group.

The poly(oxyfluoroalkylene) chain contains a plurality of units represented by the formula (1):

(OX)                                                          (1)

X is a fluoroalkylene group having at least one fluorine atom.

The number of carbon atoms in the fluoroalkylene group is preferably from 1 to 6, particularly preferably from 2 to 4, in that the water/oil repellent layer will be more excellent in weather resistance and corrosion resistance.

The fluoroalkylene group may be linear or branched, and in that more excellent effects of the present invention will be obtained, preferably linear.

The number of fluorine atoms in the fluoroalkylene group is, in that the water/oil repellent layer will be more excellent in corrosion resistance, preferably from 1 to 2 times the number of carbon atoms, particularly preferably from 1.7 to 2 times.

The fluoroalkylene group may be a group having all the hydrogen atoms in the fluoroalkylene group substituted by fluorine atoms (perfluoroalkylene group).

As specific examples of the units (1), —OCHF—, —OCF$_2$CHF—, —OCHFCF$_2$—, —OCF$_2$CH$_2$—, —OCH$_2$CF$_2$—, —OCF$_2$CF$_2$CHF—, —OCHFCF$_2$CF$_2$—, —OCF$_2$CF$_2$CH$_2$—, —OCH$_2$CF$_2$CF$_2$—, —OCF$_2$CF$_2$CF$_2$CH$_2$—, —OCH$_2$CF$_2$CF$_2$CF$_2$—, —OCF$_2$CF$_2$CF$_2$CF$_2$CH$_2$—, —OCH$_2$CF$_2$CF$_2$CF$_2$CF$_2$—, —OCF$_2$CF$_2$CF$_2$CF$_2$CF$_2$CH$_2$—, —OCH$_2$CF$_2$CF$_2$CF$_2$CF$_2$CF$_2$—, —OCF$_2$—, —OCF$_2$CF$_2$—, —OCF$_2$CF$_2$CF$_2$—, —OCF(CF$_3$)CF$_2$—, —OCF$_2$CF$_2$CF$_2$CF$_2$—, —OCF(CF$_3$)CF$_2$CF$_2$—, —OCF$_2$CF$_2$CF$_2$CF$_2$CF$_2$—, —OCF$_2$CF$_2$CF$_2$CF$_2$CF$_2$CF$_2$— may be mentioned.

The number m of repetition of the units (1) contained in the poly(oxyfluoroalkylene) chain is at least 2, preferably an integer of from 2 to 200, more preferably an integer of from 5 to 150, particularly preferably an integer of from 5 to 100, most preferably an integer of from 10 to 50.

The poly(oxyfluoroalkylene) chain may contain two or more types of the units (1). The two or more types of the units (1) may, for example, be two or more types of the units (1) differing in the number of carbon atoms, two or more types of the units (1) having the same number of carbon atoms but differing in whether the units have a side chain or not or in the type of the side chain, or two or more types of the units (1) having the same number of carbon atoms but differing in the number of fluorine atoms.

The bonding order of the two or more types of (OX) is not limited, and they may be arranged randomly, alternately or in blocks.

The poly(oxyfluoroalkylene) chain is preferably a poly(oxyfluoroalkylene) chain composed mainly of the units (1) as the oxyperfluoroalkylene group, in order to obtain a film excellent in fingerprint stain removability. In the poly(oxyfluoroalkylene) chain represented by (OX)$_m$, the proportion of the number of the units (1) as the oxyperfluoroalkylene group to the total number m of the units (1) is preferably from 50 to 100%, more preferably from 80 to 100%, particularly preferably from 90 to 100%.

The poly(oxyfluoroalkylene) chain is more preferably a poly(oxyperfluoroalkylene) chain or a poly(oxyperfluoroalkylene) chain having one or two oxyfluoroalkylene units having a hydrogen atom on one terminal or on both terminals.

(OX)$_m$ which the poly(oxyfluoroalkylene) chain has is preferably (OCH$_{ma}$F$_{(2-ma)}$)$_{m11}$(OC$_2$H$_{mb}$F$_{(4-mb)}$)$_{m12}$(OC$_3$H$_{mc}$F$_{(6-mc)}$)$_{m13}$(OC$_4$H$_{md}$F$_{(8-md)}$)$_{m14}$(OC$_5$H$_{me}$F$_{(10-me)}$)$_{m15}$(OC$_6$H$_{mf}$F$_{(12-mf)}$)$_{m16}$.

ma is 0 or 1, mb is an integer of from 0 to 3, mc is an integer of from 0 to 5, md is an integer of from 0 to 7, me is an integer of from 0 to 9, and mf is an integer of from 0 to 11.

m11, m12, m13, m14, m15 and m16 are each independently an integer of at least 0, and preferably at most 100.

m11+m12+m13+m14+m15+m16 is an integer of at least 2, preferably an integer of from 2 to 200, more preferably an integer of from 5 to 150, further preferably an integer of from 5 to 100, particularly preferably an integer of from 10 to 50.

Particularly, m12 is preferably an integer of at least 2, particularly preferably an integer of from 2 to 200.

Further, $C_3H_{mc}F_{(6-mc)}$, $C_4H_{md}F_{(8-md)}$, $C_5H_{me}F_{(10-me)}$ and $C_6H_{mf}F_{(12-mf)}$ may be linear or branched, and in that the water/oil repellent layer will be more excellent in abrasion resistance, preferably linear.

The above formula represents the type and number of units, and does not represent arrangement of the units. That is, m11 to m16 represent the number of units, and for example, $(OCH_{ma}F_{(2-ma)})_{m11}$ does not necessarily represent a block of continuous m11 $(OCH_{ma}F_{(2-ma)})$ units. Likewise, the order of description of $(OCH_{ma}F_{(2-ma)})$ to $(OC_6H_{mf}F_{(12-mf)})$ does not represent arrangement of them in the order of description.

In the above formula, in a case where two or more of m11 to m16 are not 0 (that is, $(OX)_m$ consists of two or more types of units), the arrangement of different units may be random, alternate, in blocks, or a combination thereof.

Further, in a case where two or more of each of the above units are contained, they may be different. For example, in a case where m11 is 2 or more, the plurality of $(OCH_{ma}F_{(2-ma)})$ may be the same or different.

The reactive silyl group is preferably a group represented by the formula (2):

$$—Si(R)_nL_{3-n} \quad (2)$$

The number of the group (2) in the fluorinated ether compound is one or more, and in that the water/oil repellent layer will be more excellent in abrasion resistance, preferably two or more, more preferably from 2 to 10, further preferably from 2 to 5, particularly preferably 2 or 3.

In a case where there are two or more groups (2) in one molecule, the two or more groups (2) may be the same or different. In view of availability of materials and production efficiency of the fluorinated ether compound, the two or more groups (2) are preferably the same.

R is a monovalent hydrocarbon group, preferably a saturated monovalent hydrocarbon group. The number of carbon atoms in R is preferably from 1 to 6, more preferably from 1 to 3, particularly preferably from 1 to 2.

L is a hydrolysable group or a hydroxy group.

The hydrolysable group is a group which becomes a hydroxy group by being hydrolyzed. That is, a hydrolysable silyl group represented by Si-L becomes a silanol group represented by Si—OH by being hydrolyzed. The silanol groups further react with each other to form a Si—O—Si bond. Further, the silanol group undergoes dehydration condensation reaction with a silanol group derived from the oxide contained in the undercoat layer to form a Si—O—Si bond.

The hydrolysable group may, for example, be specifically an alkoxy group, an aryloxy group, a halogen atom, an acyl group, an acyloxy group or an isocyanate group (—NCO). The alkoxy group is preferably a $C_{1-4}$ alkoxy group. The aryloxy group is preferably a $C_{3-10}$ aryloxy group. The aryl group in the aryloxy group includes a heteroaryl group. The halogen atom is preferably a chlorine atom. The acyl group is preferably a $C_{1-6}$ acyl group. The acyloxy group is preferably a $C_{1-6}$ acyloxy group.

L is, in view of more easy production of the fluorinated ether compound, preferably a $C_{1-4}$ alkoxy group or a halogen atom. L is, in that outgassing at the time of coating is small and the fluorinated ether compound will be more excellent in storage stability, preferably a $C_{1-4}$ alkoxy group, and in a case where the fluorinated ether compound is required to have long-term storage stability, particularly preferably an ethoxy group, and in a case where the reaction time after coating is to be short, particularly preferably a methoxy group.

n is an integer of from 0 to 2.

n is preferably 0 or 1, particularly preferably 0. By the presence of a plurality of L, adhesion of the water/oil repellent layer to the undercoat layer will be stronger.

When n is 1 or less, the plurality of L present in one molecule may be the same or different. In view of availability of materials and production efficiency of the fluorinated ether compound, they are preferably the same. When n is 2, the plurality of R present in one molecule may the same or different. In view of availability of materials and production efficiency of the fluorinated ether compound, they are preferably the same.

The fluorinated ether compound is, in that the water/oil repellent layer will be more excellent in water/oil repellency and abrasion resistance, preferably a compound represented by the formula (3):

$$[A-(OX)_m—O-]_jZ[—Si(R)_nL_{3-n}]_g \quad (3)$$

A is a perfluoroalkyl group or $-Q[-Si(R)_nL_{3-n}]_k$

The number of carbon atoms in the perfluoroalkyl group is, in that the water/oil repellent layer will be more excellent in abrasion resistance, preferably from 1 to 20, more preferably from 1 to 10, further preferably from 1 to 6, particularly preferably from 1 to 3.

The perfluoroalkyl group may be linear or branched.

When A is $-Q[-Si(R)_nL_{3-n}]_k$, j is 1.

The perfluoroalkyl group may, for example, be $CF_3—$, $CF_3CF_2—$, $CF_3CF_2CF_2—$, $CF_3CF_2CF_2CF_2—$, $CF_3CF_2CF_2CF_2CF_2—$, $CF_3CF_2CF_2CF_2CF_2CF_2—$, or $CF_3CF(CF_3)—$.

The perfluoroalkyl group is, in that the water/oil repellent layer will be more excellent in water/oil repellency, preferably $CF_3—$, $CF_3CF_2—$, or $CF_3CF_2CF_2—$.

Q is a (k+1) valent linking group. As described hereinafter, k is an integer of from 1 to 10. Accordingly, Q is a bivalent to undecavalent linking group.

Q may be any group which does not impair the effects of the present invention, and may, for example, be an alkylene group which may have an etheric oxygen atom or a bivalent organopolysiloxane residue, a carbon atom, a nitrogen atom, a silicon atom, a bivalent to octavalent organopolysiloxane residue, or groups (g2-1) to (g2-9) and groups (g3-1) to (g3-9).

R, L, n, X and m are as defined above.

Z is a (j+g) valent linking group.

Z may be any group which does not impair the effects of the present invention and may, for example, be an alkylene group which may have an etheric oxygen atom or a bivalent organopolysiloxane residue, a carbon atom, a nitrogen atom, a silicon atom, a bivalent to octavalent organopolysiloxane residue, or groups (g2-1) to (g2-9) and groups (g3-1) to (g3-9).

j is an integer of at least 1, and in that the water/oil repellent layer will be more excellent in water/oil repellency, preferably an integer of from 1 to 5, and in that the compound (3) will readily be produced, particularly preferably 1.

g is an integer of at least 1, and in that the water/oil repellent layer will be more excellent in abrasion resistance, preferably an integer of from 2 to 4, more preferably 2 or 3, particularly preferably 3.

The compound (3) is, in that the water/oil repellent layer will be more excellent in initial water contact angle and abrasion resistance, preferably compound (3-11), (3-21) or (3-31). Among them, with the compounds (3-11) and (3-21), the water/oil repellent layer will be particularly excellent in initial water contact angle, and with the compound (3-31), the water/oil repellent layer will be particularly excellent in abrasion resistance.

$$R^{f1}-(OX)_m-O-Y^{11}[-Si(R)_nL_{3-n}]_{g1} \quad (3\text{-}11)$$

$$[R^{f2}-(OX)_m-O-]_{j2}Y^{21}[-Si(R)_nL_{3-n}]_{g2} \quad (3\text{-}21)$$

$$[L_{3-n}(R)_nSi-]_{k3}Y^{32}-(OX)_m-O-Y^{31}[-Si(R)_nL_{3-n}]_{g3} \quad (3\text{-}31)$$

In the formula (3-11), X, m, R, n and L are respectively the same as X, m, R, n and L in the formula (3).

$R^{f1}$ is a perfluoroalkyl group, and the preferred embodiments and specific examples of the perfluoroalkyl group are as described above.

$Y^{11}$ is a (g1+1) valent linking group, and its specific examples are the same as Z in the formula (3).

g1 is an integer of at least 2, and in that the water/oil repellent layer will be more excellent in abrasion resistance, preferably an integer of from 2 to 15, more preferably an integer of from 2 to 4, further preferably 2 or 3, particularly preferably 3.

In the formula (3-21), X, m, R, n and L are respectively the same as X, m, R, n and L in the formula (3).

$R^{f2}$ is a perfluoroalkyl group, and the preferred embodiments and specific examples of the perfluoroalkyl group are as described above.

j2 is an integer of at least 2, preferably an integer of from 2 to 6, more preferably an integer of from 2 to 4.

$Y^{21}$ is a (j2+g2) valent linking group, and its specific examples are the same as Z in the formula (3).

g2 is an integer of at least 2, and in that the water/oil repellent layer will be more excellent in abrasion resistance, preferably an integer of from 2 to 15, more preferably from 2 to 6, further preferably from 2 to 4, particularly preferably 4.

In the formula (3-31), X, m, R, n and L are respectively the same as X, m, R, n and L in the formula (3).

k3 is an integer of at least 1, preferably an integer of from 1 to 4, more preferably 2 or 3, particularly preferably 3.

$Y^{32}$ is a (k3+1) valent linking group, and its specific examples are the same as Q in the formula (3).

$Y^{31}$ is a (g3+1) valent linking group, and its specific examples are the same as Z in the formula (3).

g3 is an integer of at least 1, preferably an integer of from 1 to 4, more preferably 2 or 3, particularly preferably 3.

$Y^{11}$ in the formula (3-11) may be group (g2-1) (provided that d1+d3=1 (that is, d1 or d3 is 0), g1=d2+d4, d2+d4≥2), group (g2-2) (provided that e1=1, g1=e2, e2≥2), group (g2-3) (provided that g1=2), group (g2-4) (provided that h1=1, g1=h2, h2≥2), group (g2-5) (provided that i1=1, g1=i2, i2≥2), group (g2-7) (provided that g1=i3+1), group (g2-8) (provided that g1=i4, i4≥2), or group (g2-9) (provided that g1=i5, i5≥2).

$Y^{21}$ in the formula (3-21) may be group (g2-1) (provided that j2=d1+d3, d1+d3≥2, g2=d2+d4, d2+d4≥2), group (g2-2) (provided that j2=e1, e1=2, g2=e2, e2=2), group (g2-4) (provided that j2=h1, h1≥2, g2=h2, h2≥2) or group (g2-5) (provided that j2=i1, i1=2, g2=i2, i2=2).

Further, $Y^{31}$ and $Y^{32}$ in the formula (3-31) may be independently group (g2-1) (provided that g3=d2+d4, k3=d2+d4), group (g2-2) (provided that g3=e2, k3=e2), group (g2-3) (provided that g3=2, k3=2), group (g2-4) (provided that g3=h2, k3=h2), group (g2-5) (provided that g3=i2, k3=i2), group (g2-6) (provided that g3=1, k3=1), group (g2-7) (provided that g3=i3+1, k3=i3+1), group (g2-8) (provided that g3=i4, k3=i4), or group (g2-9) (provided that g3=i5, k3=i5).

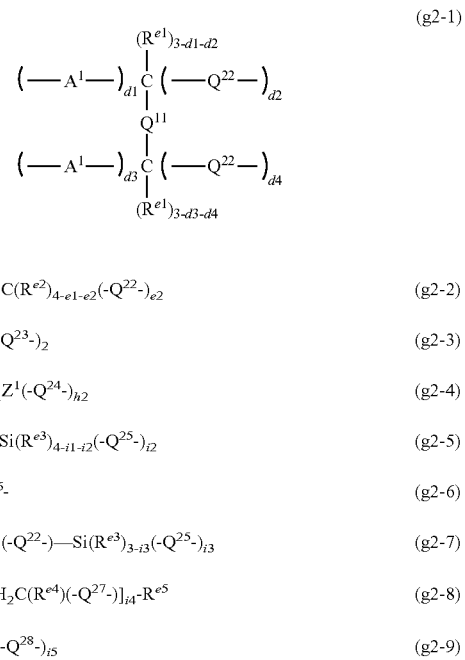

$$(-A^1-)_{e1}C(R^{e2})_{4-e1-e2}(-Q^{22}-)_{e2} \quad (g2\text{-}2)$$

$$-A^1-N(-Q^{23}-)_2 \quad (g2\text{-}3)$$

$$(-A^1-)_{h1}Z^1(-Q^{24}-)_{h2} \quad (g2\text{-}4)$$

$$(-A^1-)_{i1}Si(R^{e3})_{4-i1-i2}(-Q^{25}-)_{i2} \quad (g2\text{-}5)$$

$$-A^1-Q^{26}- \quad (g2\text{-}6)$$

$$-A^1-CH(-Q^{22}-)-Si(R^{e3})_{3-i3}(-Q^{25}-)_{i3} \quad (g2\text{-}7)$$

$$-A^1-[CH_2C(R^{e4})(-Q^{27}-)]_{i4}-R^{e5} \quad (g2\text{-}8)$$

$$-A^1-Z^a(-Q^{28}-)_{i5} \quad (g2\text{-}9)$$

In the formulae (g2-1) to (g2-9), the $A^1$ side is connected to $(OX)_m$, and $Q^{22}$, $Q^{23}$, $Q^{24}$, $Q^{25}$, $Q^{26}$, $Q^{27}$ or $Q^{28}$ side is connected to $[-Si(R)_nL_{3-n}]$.

$A^1$ is a single bond, an alkylene group or an alkylene group having at least 2 carbon atoms and having between carbon-carbon atoms $-C(O)NR^6-$, $-C(O)-$, $-OC(O)O-$, $-NHC(O)O-$, $-NHC(O)NR^6-$, $-O-$ or $-SO_2NR^6-$, and in each formula, when two or more $A^1$ are present, the two or more $A^1$ may be the same or different. The hydrogen atom in the alkylene group may be substituted by a fluorine atom.

$Q^{22}$ is an alkylene group, an alkylene group having at least 2 carbon atoms and having between carbon-carbon atoms $-C(O)NR^6-$, $-C(O)-$, $-NR^6-$ or $-O-$, an alkylene group having $-C(O)NR^6-$, $-C(O)-$, $-NR^6-$ or $-O-$ at the terminal on the side not connected to Si, or an alkylene group having at least 2 carbon atoms and having between carbon-carbon atoms $-C(O)NR^6-$, $-C(O)-$, $-NR^6-$ or $-O-$ and having $-C(O)NR^6-$, $-C(O)-$, $-NR^6-$ or $-O-$ at the terminal on the side not connected to Si, and in each formula, when two or more $Q^{22}$ are present, the two or more $Q^{22}$ may be the same or different.

$Q^{23}$ is an alkylene group, or an alkylene group having at least 2 carbon atoms and having between carbon-carbon atoms $-C(O)NR^6-$, $-C(O)-$, $-NR^6-$ or $-O-$, and the two $Q^{23}$ may be the same or different.

$Q^{24}$ is $Q^{22}$ when the atom in $Z^1$ to which $Q^{24}$ is bonded is a carbon atom, $Q^{23}$ when the atom in $Z^1$ to which $Q^{24}$ is bonded is a nitrogen atom, and in each formula, when two or more $Q^{24}$ are present, the two or more $Q^{24}$ may be the same or different.

$Q^{25}$ is an alkylene group, or an alkylene group having at least 2 carbon atoms and having between carbon-carbon atoms $-C(O)NR^6-$, $-C(O)-$, $-NR^6-$ or $-O-$, and in each formula, when two or more $Q^{25}$ are present, the two or more $Q^{25}$ may be the same or different.

$Q^{26}$ is an alkylene group, or an alkylene group having at least 2 carbon atoms and having between carbon-carbon atoms —C(O)NR$^6$—, —C(O)—, —NR$^6$— or —O—.

$R^6$ is a hydrogen atom, a $C_{1-6}$ alkyl group or a phenyl group.

$Q^{27}$ is a single bond or an alkylene group.

$Q^{28}$ is an alkylene group, or an alkylene group having at least 2 carbon atoms and having between carbon-carbon atoms an etheric oxygen atom or a bivalent organopolysiloxane residue.

$Z^1$ is a group having a h1+h2 valent cyclic structure having a carbon atom or a nitrogen atom to which $A^1$ is directly bonded and having a carbon atom or a nitrogen atom to which $Q^{24}$ is directly bonded.

$R^{e1}$ is a hydrogen atom or an alkyl group, and in each formula, when two or more Rei are present, the two or more $R^{e1}$ may be the same or different.

$R^{e2}$ is a hydrogen atom, a hydroxy group, an alkyl group or an acyloxy group.

$R^{e3}$ is an alkyl group.

$R^{e4}$ is a hydrogen atom or an alkyl group and in view of easy production of the compound, preferably a hydrogen atom. In each formula, when two or more $R^{e4}$ are present, the two or more $R^{e4}$ may be the same or different.

$R^{e5}$ is a hydrogen atom or a halogen atom, and in view of easy production of the compound, preferably a hydrogen atom.

d1 is an integer of from 0 to 3, preferably 1 or 2. d2 is an integer of from 0 to 3, preferably 1 or 2. d1+d2 is an integer of from 1 to 3.

d3 is an integer of from 0 to 3, and is preferably 0 or 1. d4 is an integer of from 0 to 3, preferably 2 or 3. d3+d4 is an integer of from 1 to 3.

d1+d3 is, in $Y^{11}$ and $Y^{21}$, an integer of from 1 to 5, preferably 1 or 2, and in $Y^{11}$, $Y^{31}$ and $Y^{32}$, 1.

d2+d4 is, in $Y^{11}$ and $Y^{21}$, an integer of from 2 to 5, preferably 4 or 5, and in $Y^{31}$ and $Y^{32}$, an integer of from 3 to 5, preferably 4 or 5.

e1+e2 is 3 or 4. e1 is 1 in $Y^{11}$, an integer of from 2 to 3 in $Y^{21}$, and 1 in $Y^{31}$ and $Y^{32}$. e2 is 2 or 3 in $Y^{11}$ and $Y^{21}$, and 2 or 3 in $Y^{31}$ and $Y^{32}$.

h1 is 1 in $Y^{11}$, an integer of at least 2 (preferably 2) in $Y^{21}$, and 1 in $Y^{31}$ and $Y^{32}$. h2 is an integer of at least 2 (preferably 2 or 3) in $Y^{11}$ and $Y^{21}$, and an integer of at least 1 (preferably 2 or 3) in $Y^{31}$ and $Y^{32}$.

i1+i2 is 3 or 4 in $Y^{11}$, 4 in $Y^{12}$, and 3 or 4 in $Y^{31}$ and $Y^{32}$. i1 is 1 in $Y^{11}$, 2 in $Y^{21}$ and 1 in $Y^{31}$ and $Y^{32}$. i2 is 2 or 3 in $Y^{11}$, 2 in $Y^{12}$, and 2 or 3 in $Y^{31}$ and $Y^{32}$.

i3 is 2 or 3.

i4 is at least 2 (preferably an integer of from 2 to 10, particularly preferably an integer of from 2 to 6) in $Y^{11}$, and at least 1 (preferably an integer of from 1 to 10, particularly preferably an integer of from 1 to 6) in $Y^{31}$ and $Y^{32}$.

i5 is at least 2, preferably an integer of from 2 to 7.

The number of carbon atoms in the alkylene group in $Q^{22}$, $Q^{23}$, $Q^{24}$, $Q^{25}$, $Q^{26}$, $Q^{27}$ and $Q^{28}$ is, in that the compounds (3-11), (3-21) and (3-31) are readily produced and in that the water/oil repellent layer will be more excellent in abrasion resistance, light resistance and chemical resistance, preferably from 1 to 10, more preferably from 1 to 6, particularly preferably from 1 to 4. When the alkylene group has a specific bond between carbon-carbon atoms, the lower limit of the number of carbon atoms in such an alkylene group is 2.

As the cyclic structure in $Z^1$, the above-described cyclic structures may be mentioned, and the preferred embodiments are also the same. Since $A^1$ and $Q^{24}$ are directly bonded to the cyclic structure in $Z^1$, $A^1$ and $Q^{24}$ will not be connected to, for example, an alkylene group connected to the cyclic structure.

$Z^a$ is a (i5+1) valent organopolysiloxane residue, and the following groups are preferred. In the following formulae, $R^a$ is an alkyl group (preferably $C_{1-10}$) or a phenyl group.

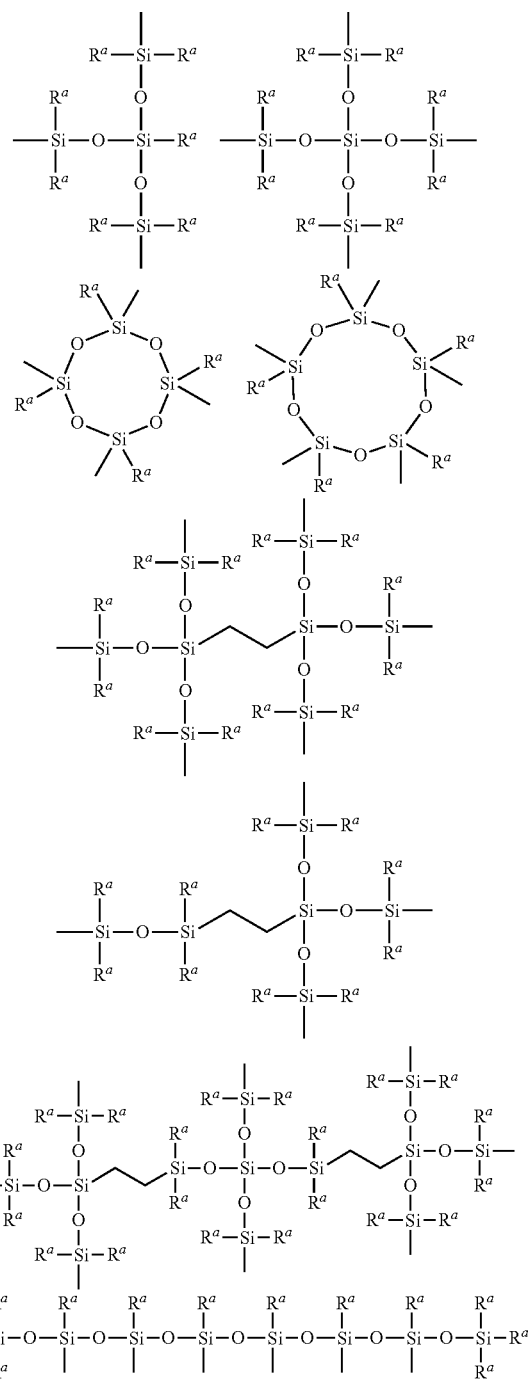

The number of carbon atoms in the alkyl group as Rei, $R^{e2}$, $R^{e3}$ and $R^{e4}$ is, in that the compounds (3-11), (3-21) and (3-31) are readily produced, preferably from 1 to 10, more preferably from 1 to 6, further preferably from 1 to 3, particularly preferably from 1 to 2.

The number of carbon atoms in the alkyl group moiety in the acyloxy group as $R^{e2}$ is, in that the compounds (3-11), (3-21) and (3-31) are readily produced, preferably from 1 to 10, more preferably from 1 to 6, further preferably from 1 to 3, particularly preferably from 1 to 2.

h1 is, in that the compounds (3-11), (3-21) and (3-31) are readily produced, and in that the water/oil repellent layer will be more excellent in abrasion resistance and fingerprint stain removability, preferably from 1 to 6, more preferably from 1 to 4, further preferably 1 or 2, particularly preferably 1.

h2 is, in that the compounds (3-11), (3-21) and (3-31) are readily produced, and in that the water/oil repellent layer will be more excellent in abrasion resistance and fingerprint stain removability, preferably from 2 to 6, more preferably from 2 to 4, particularly preferably 2 or 3.

As other embodiment of $Y^{11}$, group (g3-1) (provided that d1+d3=1 (that is, d1 or d3 is 0), g1=d2×r1+d4×r1), group (g3-2) (provided that e1=1, g1=e2×r1), group (g3-3) (provided that g1=2×r1), group (g3-4) (provided that h1=1, g1=h2×r1), group (g3-5) (provided that i1=1, g1=i2×r1), group (g3-6) (provided that g1=r1), group (g3-7) (provided that g1=r1×(i3+1)), group (g3-8) (provided that g1=r1×i4), or group (g3-9) (provided that g1=r1×i5) may be mentioned.

As other embodiment of $Y^{21}$, group (g3-1) (provided that j2=d1+d3, d1+d3≥2, g2=d2×r1+d4×r1), group (g3-2) (provided that j2=e1, e1=2, g2=e2×r1, e2=2), group (g3-4) (provided that j2=h1, h1≥2, g2=h2×r1), or group (g3-5) (provided that j2=i1, i1 is 2 or 3, g2=i2×r1, i1+i2 is 3 or 4) may be mentioned.

As other embodiment of $Y^{31}$ and $Y^{32}$, group (g3-1) (provided that g3=d2×r1+d4×r1, k3=d2×r1+d4×r1), group (g3-2) (provided that g3=e2×r1, k3=e2×r1), group (g3-3) (provided that g3=2×r1, k3=2×r1), group (g3-4) (provided that g3=h2×r1, k3=h2×r1), group (g3-5) (provided that g3=i2×r1, k3=i2×r1), group (g3-6) (provided that g3=r1, k3=r1), group (g3-7) (provided that g3=r1×(i3+1), k3=r1×(i3+1)), group (g3-8) (provided that g3=r1×i4, k3=r1×i4), or group (g3-9) (provided that g3=r1×i5, k3=r1×i5) may be mentioned.

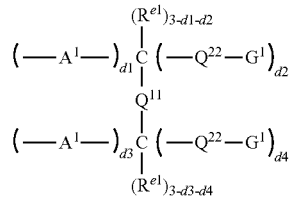
(g3-1)

$(-A^1-)_{e1}C(R^{e2})_{4-e1-e2}(-Q^{22}-G^1)_{e2}$ (g3-2)

$-A^1-N(-Q^{23}-G^1)_2$ (g3-3)

$(-A^1-)_{h1}Z^1(-Q^{24}-G^1)_{h2}$ (g3-4)

$(-A1-)_{i1}Si(R^{e3})_{4-i1-i2}(-Q^{25}-G^1)_{i2}$ (g3-5)

$-A^1-Q^{26}-G^1$ (g3-6)

$-A^1-CH(-Q^{22}-G^1)-Si(R^{e3})_{3-i3}(-Q^{25}-G^1)_{i3}$ (g3-7)

$-A^1-[CH_2C(R^{e4})(-Q^{27}-G^1)]_{i4}-R^{e5}$ (g3-8)

$-A^1-Z^a(-Q^{28}-G^1)_{i5}$ (g3-9)

In the formulae (g3-1) to (g3-9), the $A^1$ side is connected to $(OX)_m$, and the $G^1$ side is connected to $[-Si(R)_nL_{3-n}]$.

$G^1$ is group (g3), and in each formula, when two or more $G^1$ are present, the two or more $G^1$ may be the same or different. Symbols other than $G^1$ are the same as symbols in the formulae (g2-1) to (g2-9).

$$-Si(R^8)_{3-r1}(-Q^3-)_{r1} \quad (g3)$$

In the formula (g3), the Si side is connected to $Q^{22}$, $Q^{23}$, $Q^{24}$, $Q^{25}$, $Q^{26}$, $Q^{27}$ or $Q^{28}$ and the $Q^3$ side is connected to $[-Si(R)_nL_{3-n}]$. $R^8$ is an alkyl group. $Q^3$ is an alkylene group, or an alkylene group having at least 2 carbon atoms and having between carbon-carbon atoms $-C(O)NR^6-$, $-C(O)-$, $-NR-$ or $-O-$, or $-(OSi(R^9)_2)_p-O-$, and two or more $Q^3$ may be the same or different. r1 is 2 or 3. $R^6$ is a hydrogen atom, or a $C_{1-6}$ alkyl group, or a phenyl group. $R^9$ is an alkyl group, a phenyl group or an alkoxy group, and two or more $R^9$ may be the same or different. p is an integer of from 0 to 5, and when p is at least 2, the two or more $(OSi(R^9)_2)$ may be the same or different.

The number of carbon atoms in the alkylene group in $Q^3$ is, in that the compounds (3-11), (3-21) and (3-31) are readily produced and in that the water/oil repellent layer will be more excellent in abrasion resistance, light resistance and chemical resistance, preferably from 1 to 10, more preferably from 1 to 6, particularly preferably from 1 to 4. When the alkylene group has a specific bond between carbon-carbon atoms, the lower limit of the number of carbon atoms in such an alkylene group is 2.

The number of carbon atoms in the alkyl group as $R^8$ is, in that the compounds (3-11), (3-21) and (3-31) are readily produced, preferably from 1 to 10, more preferably from 1 to 6, further preferably from 1 to 3, particularly preferably from 1 to 2.

The number of carbon atoms in the alkyl group as $R^9$ is, in that the compounds (3-11), (3-21) and (3-31) are readily produced, preferably from 1 to 10, more preferably from 1 to 6, further preferably from 1 to 3, particularly preferably from 1 to 2.

The number of carbon atoms in the alkoxy group as $R^9$ is, in that the compounds (3-11), (3-21) and (3-31) are excellent in storage stability, preferably from 1 to 10, more preferably from 1 to 6, further preferably from 1 to 3, particularly preferably from 1 to 2.

p is preferably 0 or 1.

As the compounds (3-11), (3-21) and (3-31), for example, the following compounds may be mentioned. The following compounds are industrially readily produced, are easily handled, and provide a water/oil repellent layer excellent in water/oil repellency, abrasion resistance, fingerprint stain removability, lubricity, chemical resistance, light resistance and chemical resistance, particularly light resistance. In the following compounds, $R^f$ is the same as that in $R^{f1}-(OX)_m-O-$ in the formula (3-11) or $R^{f2}-(OX)_m-O-$ in the formula (3-21), and the preferred embodiments are also the same. In the following compounds, $Q^f$ is the same as that in $-(OX)_m-O-$ in the formula (3-31), and the preferred embodiments are also the same.

As the compound (3-11) wherein $Y^{11}$ is group (g2-1), the following compound may, for example, be mentioned.

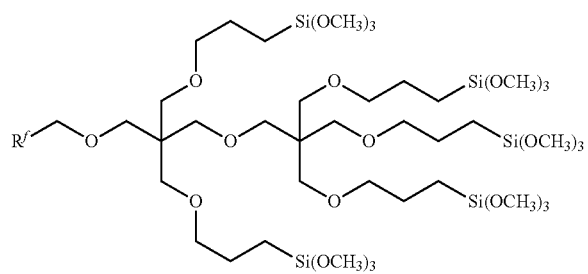
As the compound (3-11) wherein $Y^{11}$ is group (g2-2), the following compounds may, for example, be mentioned.
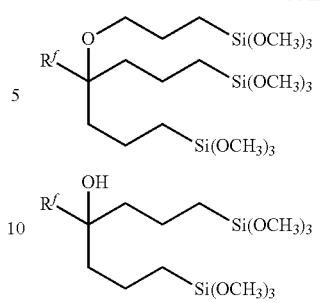
As the compound (3-21) wherein $Y^{21}$ is group (g2-2), the following compounds may, for example, be mentioned.
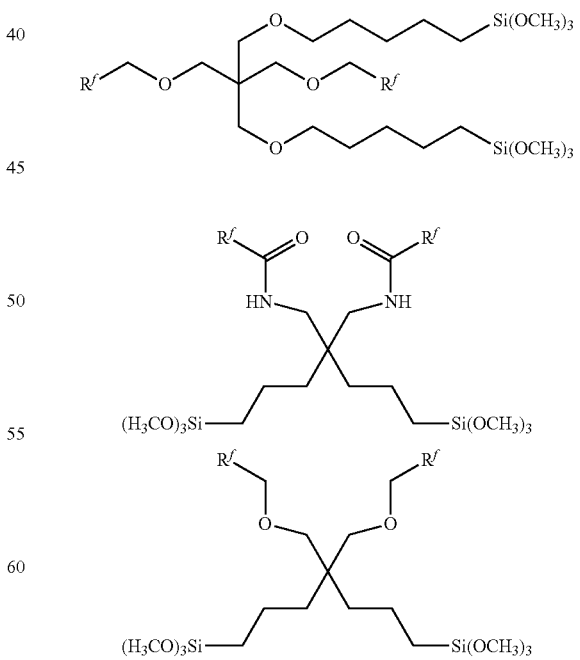
As the compound (3-11) wherein $Y^{11}$ is group (g2-3), the following compounds may, for example, be mentioned.

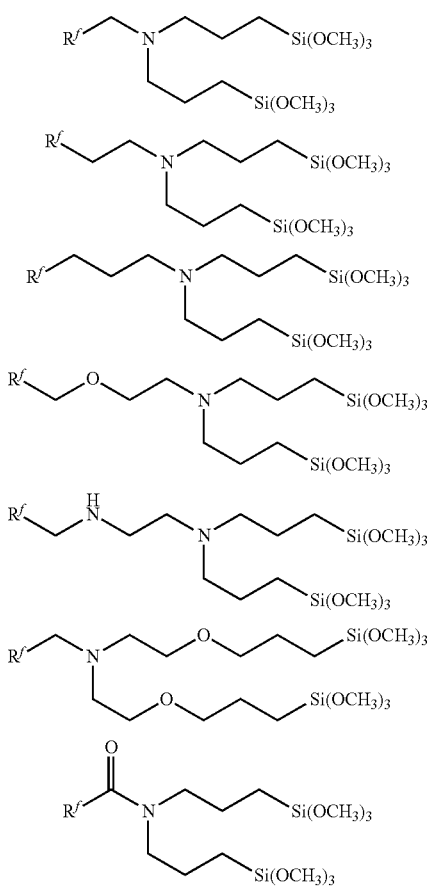
As the compound (3-11) wherein $Y^{11}$ is group (g2-4), the following compounds may, for example, be mentioned.
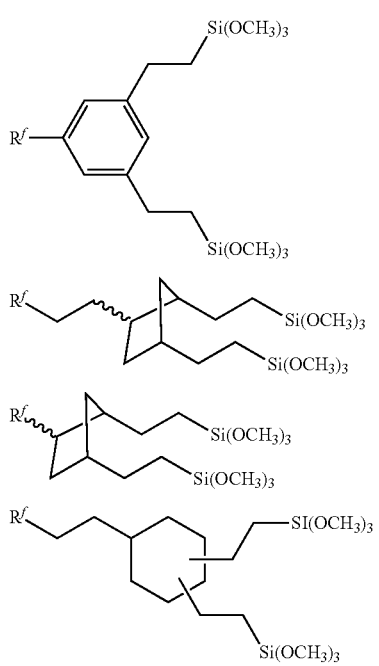
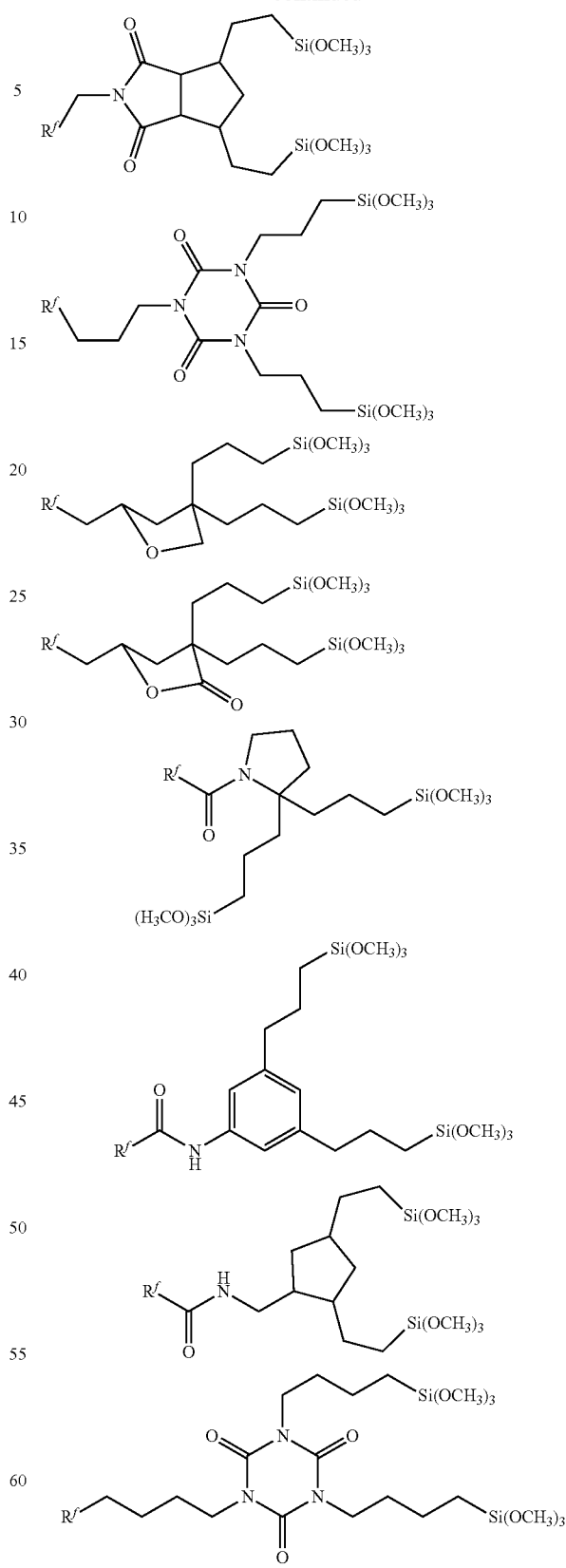
As the compound (3-11) wherein $Y^{11}$ is group (g2-5), the following compounds may, for example, be mentioned.

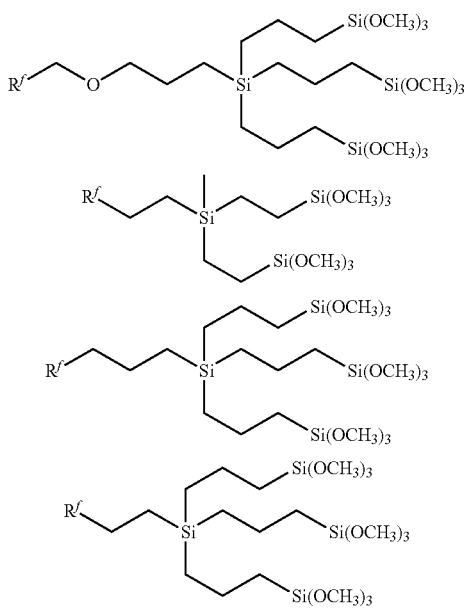
As the compound (3-11) wherein $Y^{11}$ is group (g2-7), the following compounds may, for example, be mentioned.
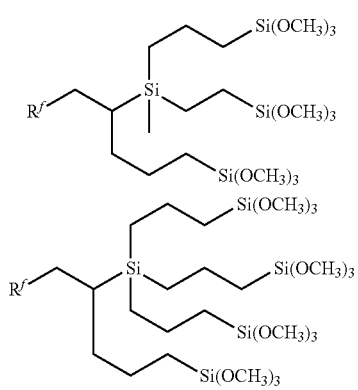
As the compound (3-11) wherein $Y^{11}$ is group (g3-1), the following compounds may, for example, be mentioned.
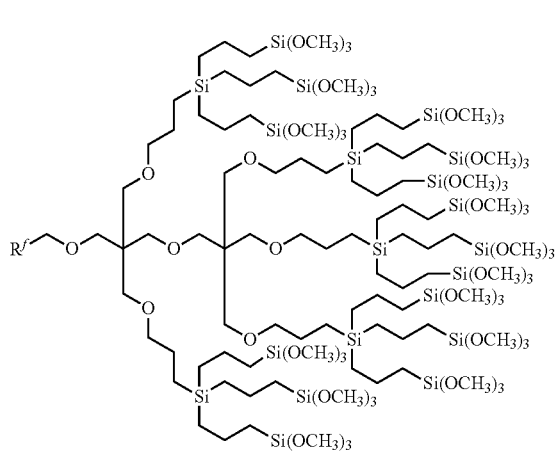
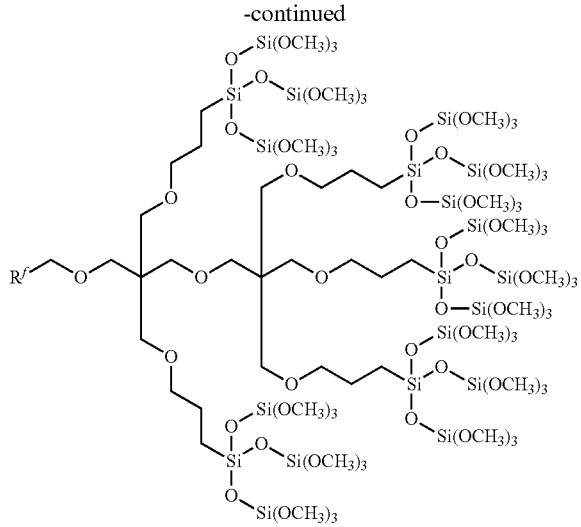
As the compound (3-11) wherein $Y^{11}$ is group (g3-2), the following compounds may, for example, be mentioned.
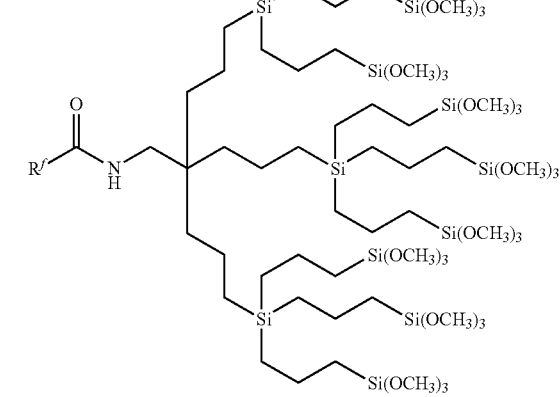
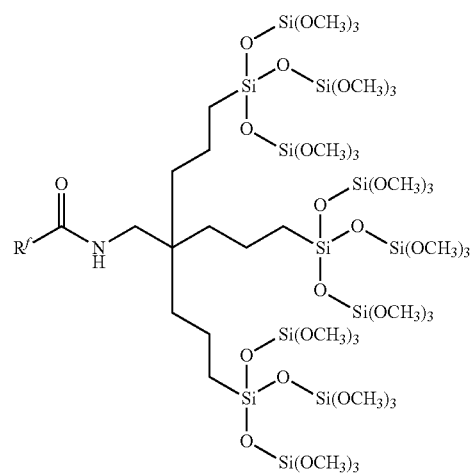

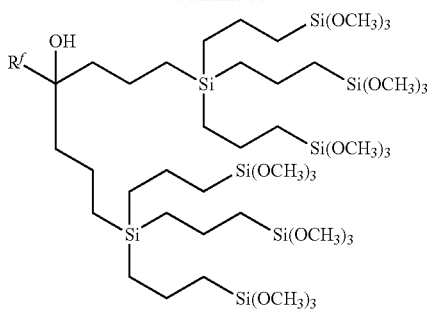
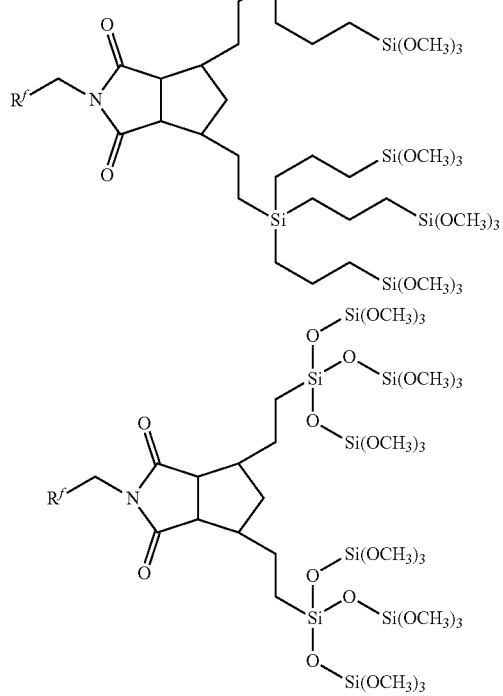
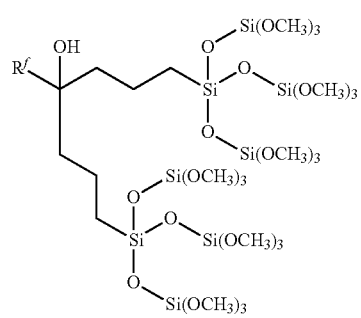
As the compound (3-11) wherein $Y^{11}$ is group (g3-3), the following compounds may, for example, be mentioned.
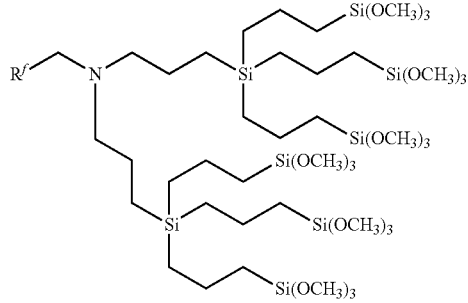
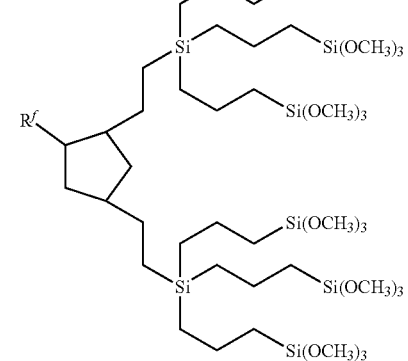
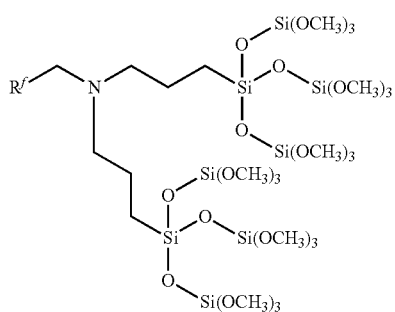
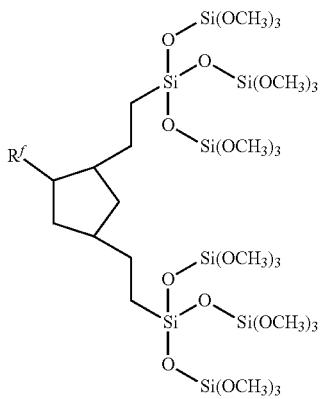
As the compound (3-11) wherein $Y^{11}$ is group (g3-4), the following compounds may, for example, be mentioned.
As the compound (3-11) wherein $Y^{11}$ is group (g3-5), the following compounds may, for example, be mentioned.

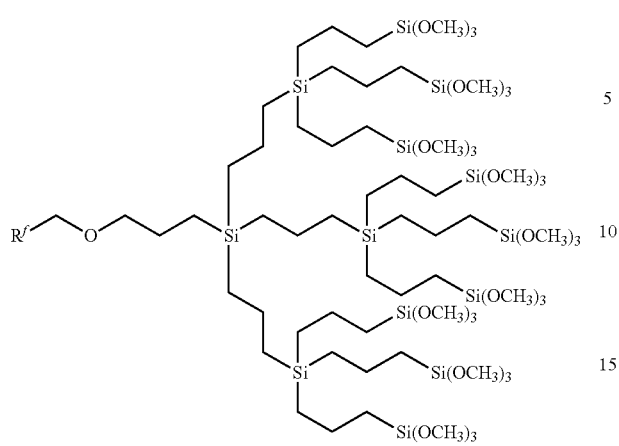

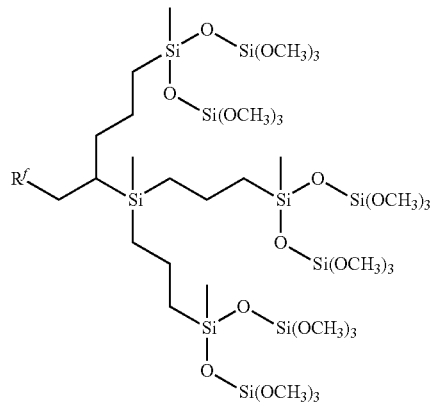

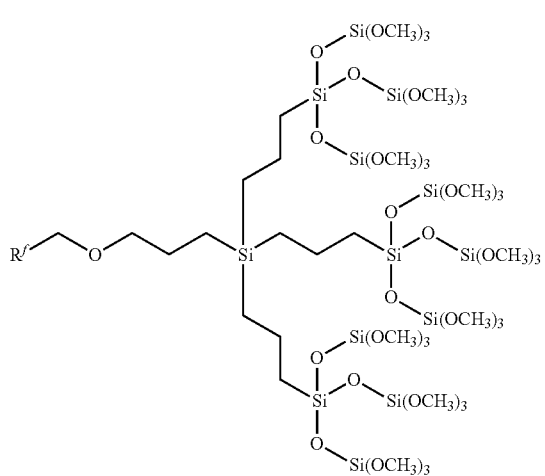

As the compound (3-11) wherein $Y^{11}$ is group (g3-6), the following compounds may, for example, be mentioned.

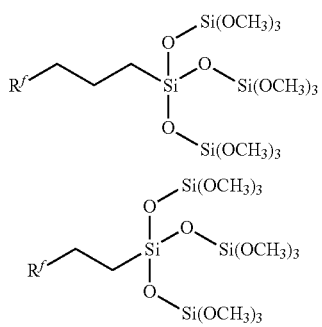

As the compound (3-11) wherein $Y^{11}$ is group (g3-7), the following compounds may, for example, be mentioned.

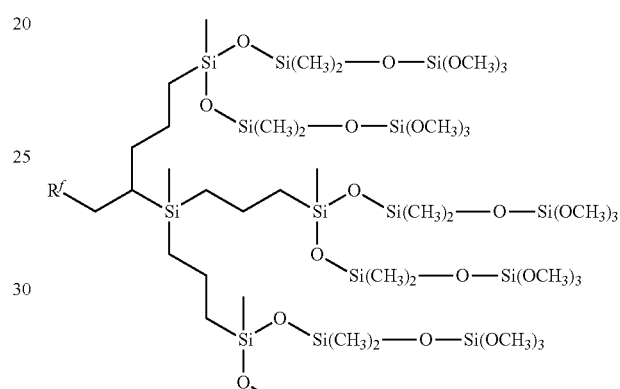

As the compound (3-21) wherein $Y^{21}$ is group (g2-1), the following compounds may, for example, be mentioned.

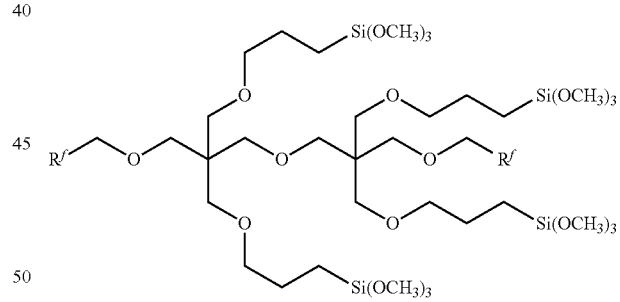

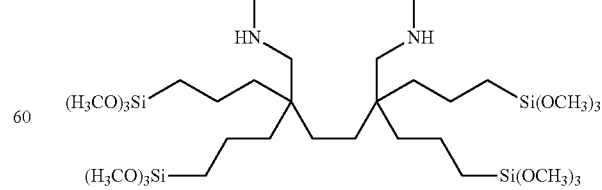

As the compound (3-31) wherein $Y^{31}$ and $Y^{32}$ are group (g2-1), the following compound may, for example, be mentioned.

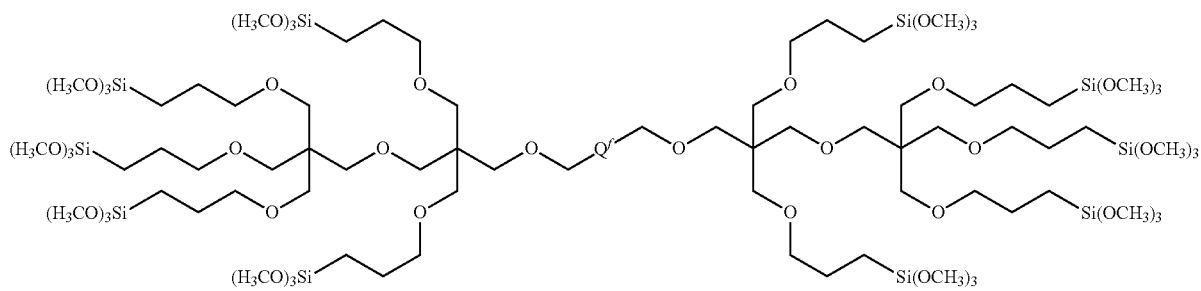

As the compound (3-31) wherein $Y^{31}$ and $Y^{32}$ are group (g2-2), the following compounds may, for example, be mentioned.

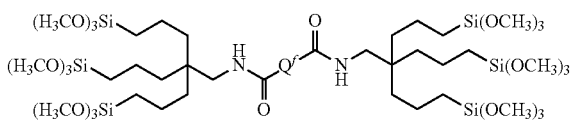

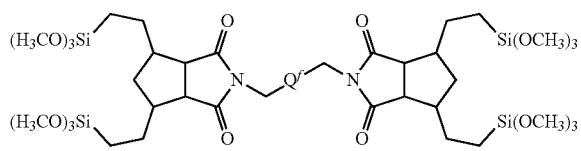

As the compound (3-31) wherein $Y^{31}$ and $Y^{32}$ are group (g2-5), the following compound may, for example, be mentioned.

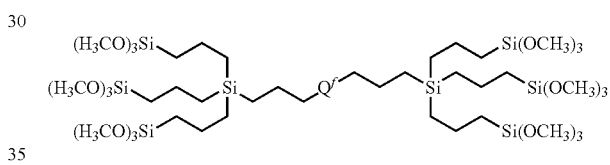

As the compound (3-31) wherein $Y^{31}$ and $Y^{32}$ are group (g2-3), the following compound may, for example, be mentioned.

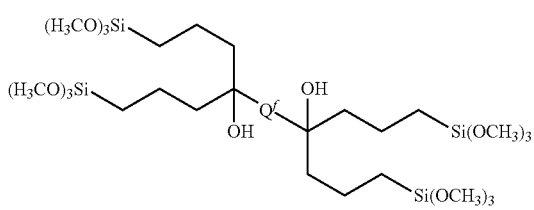

As the compound (3-31) wherein $Y^{31}$ and $Y^{32}$ are group (g2-6), the following compound may, for example, be mentioned.

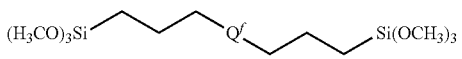

As the compound (3-31) wherein $Y^{31}$ and $Y^{32}$ are group (g2-7), the following compound may, for example, be mentioned.

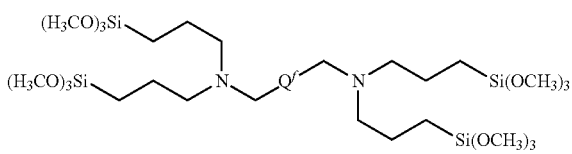

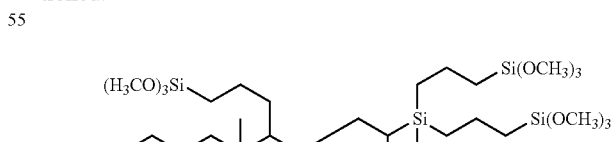

As the compound (3-31) wherein $Y^{31}$ and $Y^{32}$ are group (g2-4), the following compound may, for example, be mentioned.

As the compound (3-31) wherein $Y^{31}$ and $Y^{32}$ are group (g3-2), the following compounds may, for example, be mentioned.

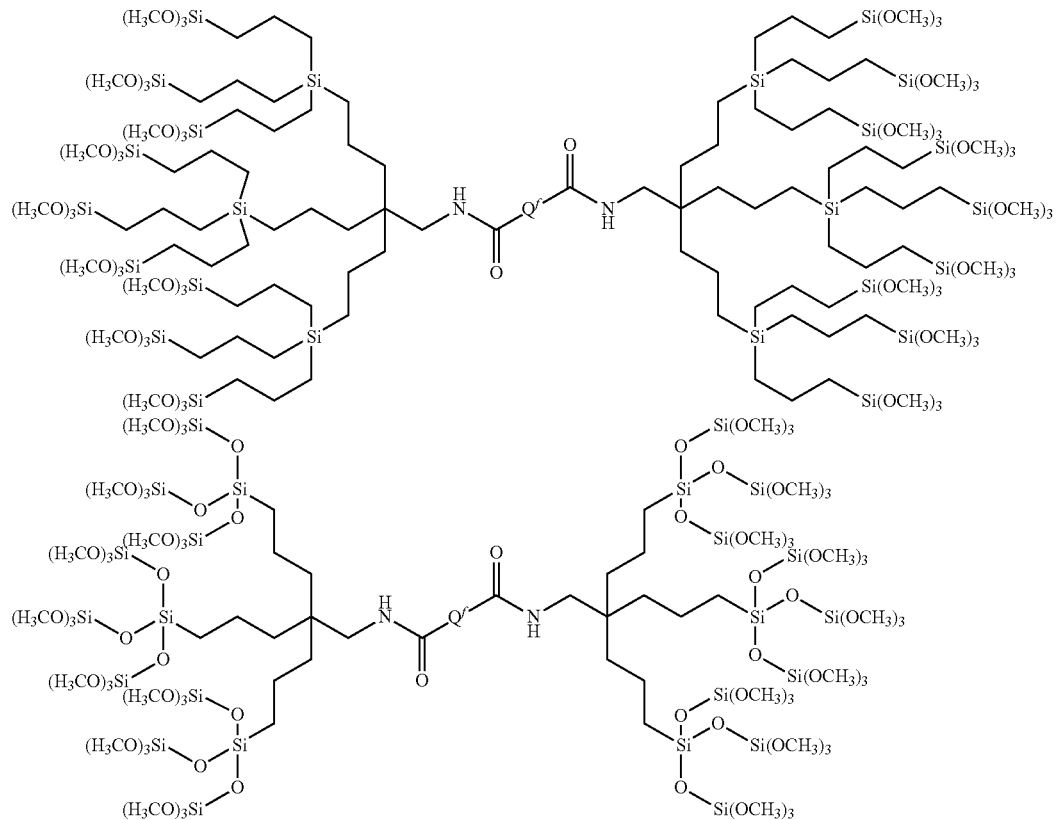

As the fluorinated ether compound, in that the film will be more excellent in water/oil repellency and abrasion resistance, a compound represented by the formula (3X) is also preferred.

$$[A\text{-}(OX)_m]_j Z'[\text{---}Si(R)_n L_{3-n}]_g \quad (3X)$$

The compound (3X) is, in that the water/oil repellent layer will be more excellent in water/oil repellency, preferably a compound represented by the formula (3-1).

$$A\text{-}(OX)_m\text{---}Z^{31} \quad (3\text{-}1)$$

In the formula (3-1), A, X and m are as defined for the respective groups in the formula (3).

Z' is a (j+g) valent linking group.

Z' is any group which does not impair the effects of the present invention and may, for example, be an alkylene group which may have an etheric oxygen atom or a bivalent organopolysiloxane residue, an oxygen atom, a carbon atom, a nitrogen atom, a silicon atom, a bivalent to octavalent organopolysiloxane residue, or a group having $Si(R)_n L_{3-n}$ removed from the formulae (3-1A), (3-1B) and (3-1A-1) to (3-1A-6).

$Z^{31}$ is group (3-1A) or group (3-1B).

$$\text{-}Q^a\text{-}X^{31}(\text{-}Q^b\text{-}Si(R)_n L_{3-n})_h(\text{---}R^{31})_i \quad (3\text{-}1A)$$

$$\text{-}Q^c\text{-}[CH_2C(R^{32})(\text{-}Q^d\text{-}Si(R)_n L_{3-n})]_v\text{-}R^{33} \quad (3\text{-}1B)$$

$Q^a$ is a single bond or a bivalent linking group.

The bivalent linking group may, for example, be a bivalent hydrocarbon group, a bivalent heterocyclic group, —O—, —S—, —SO$_2$—, —N(R$^d$)—, —C(O)—, —Si(R$^a$)$_2$— or a group having two or more of them combined.

$R^a$ is an alkyl group (preferably $C_{1-10}$) or a phenyl group. $R^d$ is a hydrogen atom or an alkyl group (preferably $C_{1-10}$).

The bivalent hydrocarbon group may be a bivalent saturated hydrocarbon group, a bivalent aromatic hydrocarbon group, an alkenylene group or an alkynylene group. The bivalent saturate hydrocarbon group may be linear, branched or cyclic, and may, for example, be an alkylene group. The number of carbon atoms in the bivalent saturated hydrocarbon group is preferably from 1 to 20. Further, the bivalent aromatic hydrocarbon group preferably has from 5 to 20 carbon atoms and may, for example, be a phenylene group. The alkenylene group is preferably a $C_2$-20 alkenylene group, and the alkynylene group is preferably a $C_2$-20 alkynylene group.

The group having two or more of them combined may, for example, be —OC(O)—, —C(O)N(R$^d$)—, an alkylene group having an etheric oxygen atom, an alkylene group having —OC(O)—, or alkylene group-Si(R$^a$)$_2$-phenylene group-Si(R$^a$)$_2$.

$X^{31}$ is a singe bond, an alkylene group, a carbon atom, a nitrogen atom, a silicon atom or a bivalent to octavalent organopolysiloxane residue.

The alkylene group may have —O—, a silphenylene skeleton group, a bivalent organopolysiloxane residue or a dialkylsilylene group. The alkylene group may have a plurality of groups selected from the group consisting of —O—, a silphenylene skeleton group, a bivalent organopolysiloxane residue and a dialkylsilylene group.

The number of carbon atoms in the alkylene group represented by $X^{31}$ is preferably from 1 to 20, particularly preferably from 1 to 10.

The bivalent to octavalent organopolysiloxane residue may be a bivalent organopolysiloxane residue or the after described (w+1) valent organopolysiloxane residue.

$Q^b$ is a singe bond or a bivalent linking group.

The bivalent linking group is as defined for the above $Q^a$.

$R^{31}$ is a hydroxy group or an alkyl group.

The number of carbon atoms in the alkyl group is preferably from 1 to 5, more preferably from 1 to 3, particularly preferably 1.

When $X^{31}$ is a singe bond or an alkylene group, h is 1, and i is 0, when $X^{31}$ is a nitrogen atom, h is an integer of from 1 to 2, i is an integer of from 0 to 1, and h+i=2 is satisfied, when $X^{31}$ is a carbon atom or a silicon atom, h is an integer of from 1 to 3, i is an integer of from 0 to 2, and h+i=3 is satisfied, and when $X^{31}$ is a bivalent to octavalent organopolysiloxane residue, h is an integer of from 1 to 7, i is an integer of from 0 to 6, and h+i=1 to 7 is satisfied.

When there are two or more (-$Q^b$-Si(R)$_n$L$_{3-n}$), the two or more (-$Q^b$-Si(R)$_n$L$_{3-n}$) may be the same or different. When there are two or more $R^{31}$, the two or more (—$R^{31}$) may be the same or different.

$Q^c$ is a singe bond, or an alkylene group which may have an etheric oxygen atom, and in view of easy production of the compound, preferably a single bond.

The number of carbon atoms in the alkylene group which may have an etheric oxygen atom is preferably from 1 to 10, particularly preferably from 2 to 6.

$R^{32}$ is a hydrogen atom or a $C_{1-10}$ alkyl group, and in view of easy production of the compound, preferably a hydrogen atom.

The alkyl group is preferably a methyl group.

$Q^d$ is a single bond or an alkylene group. The number of carbon atoms in the alkylene group is preferably from 1 to 10, particularly preferably from 1 to 6. In view of easy production of the compound, $Q^d$ is preferably a single bond or —CH$_2$—.

$R^{33}$ is a hydrogen atom or a halogen atom, and in view of easy production of the compound, preferably a hydrogen atom.

y is an integer of from 1 to 10, preferably an integer of from 1 to 6.

The two or more [CH$_2$C(R$^{32}$) (_Q$^d$-Si(R)$_n$L$_{3-n}$)] may be the same or different.

As the group (3-1A), groups (3-1A-1) to (3-1A-6) are preferred.

—(X$^{32}$)$_{s1}$-Q$^{b1}$-SiR$_n$L$_{3-n}$     (3-1A-1)

—(X$^{33}$)$_{s2}$-Q$^{a2}$-N[-Q$^{b2}$-Si(R)$_{n3}$L$_{3-n}$]$_2$     (3-1A-2)

-Q$^{a3}$-G(R$^g$)[-Q$^{b3}$-Si(R)$_n$L$_{3-n}$]$_2$     (3-1A-3)

—[C(O)N(R$^d$)]$_{s4}$-Q$_{a4}$-(O)$_{t4}$—C[—(O)$_{u4}$-Q$^{b4}$-Si(R)$_n$L$_{3-n}$]$_3$     (3-1A-4)

-Q$^{a5}$-Si[-Q$^{b5}$-Si(R)$_n$L$_{3-n}$]$_3$     (3-1A-5)

—[C(O)N(R$^d$)]$_v$-Q$^{a6}$-Z$^{a'}$[-Q$^{b6}$-Si(R)$_n$L$_{3-n}$]$_w$     (3-1A-6)

In the formulae (3-1A-1) to (3-1A-6), R, L, and n are as defined above.

$X^{32}$ is —O— or —C(O)N(R$^d$)— (provided that N in the formula is bonded to $Q^{b1}$)

$R^d$ is as defined above.

s1 is 0 or 1.

$Q^{b1}$ is an alkylene group. The alkylene group may have —O—, a silphenylene skeleton group, a bivalent organopolysiloxane residue or a dialkylsilylene group. The alkylene group may have a plurality of groups selected from the group consisting of —O—, a silphenylene skeleton group, a bivalent organopolysiloxane residue and a dialkylsilylene group.

When the alkylene group has —O—, a silphenylene skeleton group, a bivalent organopolysiloxane residue or a dialkylsilylene group, the alkylene group preferably has such a group between carbon atom-carbon atom.

The number of carbon atoms in the alkylene group represented by $Q^{b1}$ is preferably from 1 to 10, particularly preferably from 2 to 6.

$Q^{b1}$ is, when s1 is 0, preferably —CH$_2$OCH$_2$CH$_2$CH$_2$—, —CH$_2$OCH$_2$CH$_2$OCH$_2$CH$_2$CH$_2$—, —CH$_2$CH$_2$—, —CH$_2$CH$_2$CH$_2$—, or —CH$_2$OCH$_2$CH$_2$CH$_2$Si(CH$_3$)$_2$OSi (CH$_3$)$_2$CH$_2$CH$_2$—. When (X$^{32}$)S$_1$ is —O—, it is preferably —CH$_2$CH$_2$CH$_2$—, or —CH$_2$CH$_2$OCH$_2$CH$_2$CH$_2$—. When (X$^{32}$)$_{s1}$ is —C(O)N(R$^d$)—, it is preferably a $C_{2-6}$ alkylene group (provided that N in the formula is bonded to $Q^{b1}$). When $Q^{b1}$ is such a group, the compound will readily be produced.

As specific examples of the group (3-1A-1), the following groups may be mentioned. In the following formulae, * represents the position of bonding to (OX)$_m$.

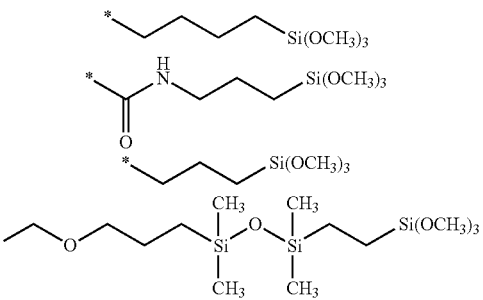

$X^{33}$ is —O—, —NH— or —C(O)N(R$^d$)-.

$R^d$ is as defined above.

$Q^{a2}$ is a single bond, an alkylene group, —C(O)— or an alkylene group having at least 2 carbon atoms and having between carbon atom-carbon atom an etheric oxygen atom, —C(O)—, —C(O)O—, —OC(O)— or —NH—.

The number of carbon atoms in the alkylene group represented by $Q^{a2}$ is preferably from 1 to 10, particularly preferably from 1 to 6.

The number of carbon atoms in the alkylene group having at least 2 carbon atoms and having between carbon atom-carbon atom an etheric oxygen atom, —C(O)—, —C(O) O—, —OC(O)— or —NH—, represented by $Q^{a2}$, is preferably from 2 to 10, particularly preferably from 2 to 6.

$Q^{a2}$ is, in that the compound will readily be produced, preferably —CH$_2$—, —CH$_2$CH$_2$—, —CH$_2$CH$_2$CH$_2$—, —CH$_2$O CH$_2$CH$_2$—, —CH$_2$NHCH$_2$CH$_2$—, —CH$_2$CH$_2$O C(O)CH$_2$CH$_2$—, or —C(O)-(provided that the right side is bonded to N).

s2 is 0 or 1 (provided that when $Q^{a2}$ is a singe bond, it is 0). It is preferably 0 in that the compound will readily be produced.

$Q^{b2}$ is an alkylene group or an alkylene group having at least 2 carbon atoms and having between carbon atom-carbon atom a bivalent organopolysiloxane residue, an etheric oxygen atom or —NH—.

The number of carbon atoms in the alkylene group represented by $Q^{b2}$ is preferably from 1 to 10, particularly preferably from 2 to 6.

The number of carbon atoms in the alkylene group having at least 2 carbon atoms and having between carbon atom-carbon atom a bivalent organopolysiloxane residue, an etheric oxygen atom or —NH—, represented by $Q^{b2}$, is preferably from 2 to 10, particularly preferably from 2 to 6.

$Q^{b2}$ is, in that the compound will readily be produced, preferably —CH$_2$CH$_2$CH$_2$—, or —CH$_2$CH$_2$OCH$_2$CH$_2$CH$_2$— (provided that the right side id bonded to Si).

The two [-$Q^{b2}$-Si(R)$_n$L$_{3-n}$] may be the same or different.

As specific examples of the group (3-1A-2), the following groups may be mentioned. In the following formulae, * represents the position of bonding to (OX)$_m$.

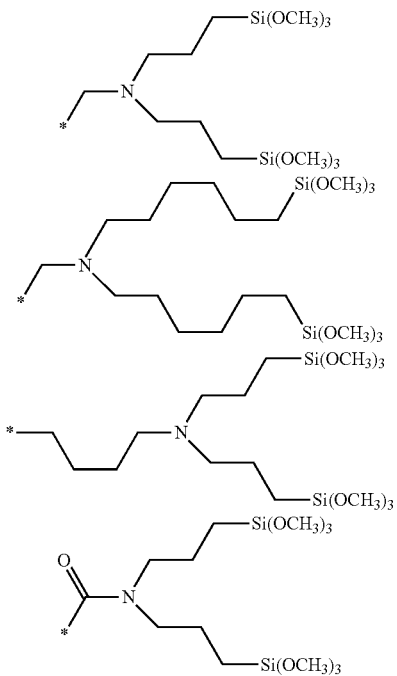

$Q^{a3}$ is a single bond or an alkylene group which may have an etheric oxygen atom, and in that the compound will readily be produced, preferably a single bond.

The number of carbon atoms in the alkylene group which may have an etheric oxygen atom is preferably from 1 to 10, particularly preferably from 2 to 6.

G is a carbon atom or a silicon atom.

$R^g$ is a hydroxy group or an alkyl group. The number of carbon atoms in the alkyl group represented by $R^g$ is preferably from 1 to 4.

G($R^g$) is, in that the compound will readily be produced, preferably C(OH) or Si($R^{ga}$) (provided that $R^{ga}$ is an alkyl group, preferably having from 1 to 10 carbon atoms, and is particularly preferably a methyl group).

$Q^{b3}$ is an alkylene group or an alkylene group having at least 2 carbon atoms and having between carbon atom-carbon atom an etheric oxygen atom or a bivalent organopolysiloxane residue.

The number of carbon atoms in the alkylene group represented by $Q^{b3}$ is preferably from 1 to 10, particularly preferably from 2 to 6.

The number of carbon atoms in the alkylene group having at least 2 carbon atoms and having between carbon atom-carbon atom an etheric oxygen atom or a bivalent organopolysiloxane residue, represented by $Q^{b3}$, is preferably from 2 to 10, particularly preferably from 2 to 6.

$Q^{b3}$ is, in that the compound will readily be produced, preferably —CH$_2$CH$_2$—, —CH$_2$CH$_2$CH$_2$—, or —CH$_2$CH$_2$CH$_2$CH$_2$CH$_2$CH$_2$CH$_2$CH$_2$—.

The two [-$Q^{b3}$-Si(R)$_n$L$_{3-n}$] may be the same or different.

As specific examples of the group (3-1A-3), the following groups may be mentioned. In the following formulae, * represents the position of bonding to (OX)$_m$.

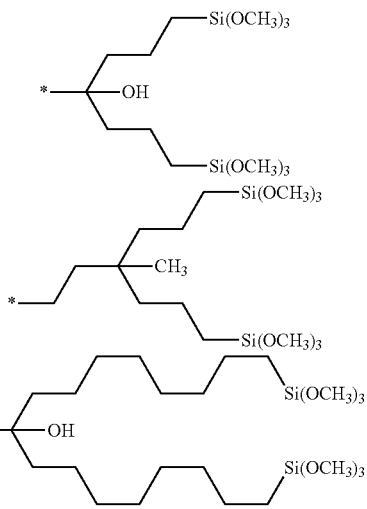

$R^d$ in the formula (3-1A-4) is as defined above.

s4 is 0 or 1.

$Q^{a4}$ is a single bond or an alkylene group which may have an etheric oxygen atom.

The number of carbon atoms in the alkylene group which may have an etheric oxygen atom is preferably from 1 to 10, particularly preferably from 2 to 6.

t4 is 0 or 1 (provided that when $Q^{a4}$ is a singe bond, it is 0).

-$Q^{a4}$-(O)$_{t4}$— is, in that the compound will readily be produced, when s4 is 0, preferably a single bond, —CH$_2$O—, —CH$_2$O CH$_2$—, —CH$_2$OCH$_2$CH$_2$O—, —CH$_2$O CH$_2$CH$_2$O CH$_2$—, or —CH$_2$OCH$_2$CH$_2$CH$_2$CH$_2$OCH$_2$— (provided that the left side is bonded to (OX)$_m$), and when s4 is 1, it is preferably a single bond, —CH$_2$—, or —CH$_2$CH$_2$—.

$Q^{b4}$ is an alkylene group, and the alkylene group may have —O—, —C(O)N($R^d$)— ($R^d$ is as defined above), a silphenylene skeleton group, a bivalent organopolysiloxane residue or a dialkylsilylene group.

In a case where the alkylene group has —O— or a silphenylene skeleton group, the alkylene group preferably has —O— or a silphenylene skeleton group between carbon atom-carbon atom. Further, in a case where the alkylene group has —C(O)N($R^d$)—, a dialkylsilylene group or a bivalent organopolysiloxane residue, the alkylene group preferably has such a group between carbon atom-carbon atom or at the terminal on the side bonded to (O)$_{u4}$.

The number of carbon atoms in the alkylene group represented by $Q^{b4}$ is preferably from 1 to 10, particularly preferably from 2 to 6.

u4 is 0 or 1.

—(O)$_{u4}$-$Q^{b4}$- is, in that the compound will readily be produced, preferably —CH$_2$CH$_2$—, —CH$_2$CH$_2$CH$_2$—, —CH$_2$OCH$_2$CH$_2$CH$_2$—, —CH$_2$OCH$_2$CH$_2$CH$_2$CH$_2$CH$_2$—, —OCH$_2$CH$_2$CH$_2$—, —OSi(CH$_3$)$_2$CH$_2$CH$_2$CH$_2$—, —OSi(CH$_3$)$_2$OSi(CH$_3$)$_2$CH$_2$CH$_2$CH$_2$—, or —CH$_2$CH$_2$CH$_2$Si(CH$_3$)$_2$PhSi(CH$_3$)$_2$CH$_2$CH$_2$— (provided that the right side is bonded to Si).

The three [—(O)$_{u4}$-Q$^{b4}$-Si(R)$_n$L$_{3-n}$] may be the same or different.

As specific examples of the group (3-1A-4), the following groups may be mentioned. In the following formulae, * represents the position of bonding to (OX)$_m$.

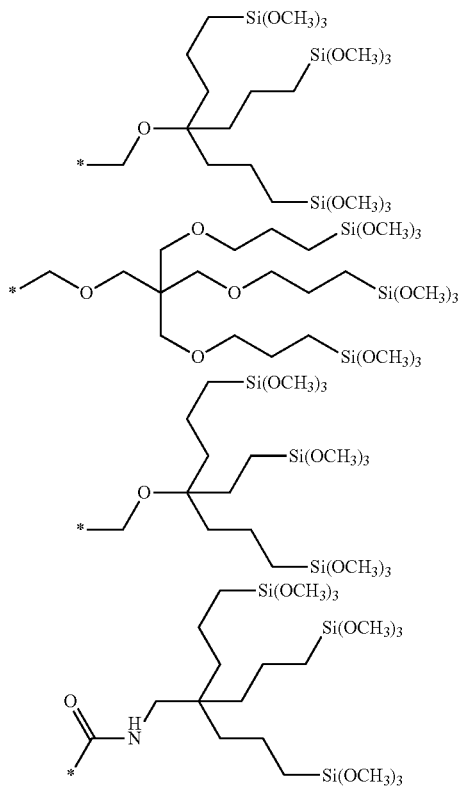

Q$^{a5}$ is an alkylene group which may have an etheric oxygen atom.

The number of carbon atoms in the alkylene group which may have an etheric oxygen atom is preferably from 1 to 10, particularly preferably from 2 to 6.

Q$^{a5}$ is, in that the compound will readily be produced, preferably —CH$_2$OCH$_2$CH$_2$CH$_2$—, —CH$_2$OCH$_2$CH$_2$OCH$_2$CH$_2$CH$_2$—, —CH$_2$CH$_2$—, or —CH$_2$CH$_2$CH$_2$-(provided that the right side is bonded to Si).

Q$^{b5}$ is an alkylene group or an alkylene group having at least 2 carbon atoms and having between carbon atom-carbon atom an etheric oxygen atom or a bivalent organopolysiloxane residue.

The number of carbon atoms in the alkylene group represented by Q$^{b5}$ is preferably from 1 to 10, particularly preferably from 2 to 6.

The number of carbon atoms in the alkylene group having at least 2 carbon atoms and having between carbon atom-carbon atom an etheric oxygen atom or a bivalent organopolysiloxane residue, represented by Q$^{b5}$, is preferably from 2 to 10, particularly preferably from 2 to 6.

Q$^{b5}$ is, in that the compound will readily be produced, preferably —CH$_2$CH$_2$CH$_2$—, or —CH$_2$CH$_2$OCH$_2$CH$_2$CH$_2$— (provided that the right side is bonded to Si(R)$_n$L$_{3-n}$).

The three [-Q$^{b5}$-Si(R)$_n$L$_{3-n}$] may be the same or different.

As specific examples of the group (3-1A-5), the following group may be mentioned. In the following formula, * represents the position of bonding to (OX)$_m$.

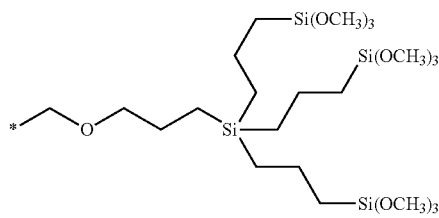

R$^d$ in the formula (3-1A-6) is as defined above.

v is 0 or 1.

Q$^{a6}$ is an alkylene group which may have an etheric oxygen atom.

The number of carbon atoms in the alkylene group which may have an etheric oxygen atom is preferably from 1 to 10, particularly preferably from 2 to 6.

Q$^{a6}$ is, in that the compound will readily be produced, preferably —CH$_2$OCH$_2$CH$_2$CH$_2$—, —CH$_2$OCH$_2$CH$_2$OCH$_2$CH$_2$CH$_2$—, —CH$_2$CH$_2$—, or —CH$_2$CH$_2$CH$_2$-(provided that the right side is bonded to Z$^{a'}$).

Z$^{a'}$ is a (w+1) valent organopolysiloxane residue.

w is at least 2, preferably an integer of from 2 to 7.

As the (w+1) valent organopolysiloxane residue, the same group as the (i5+1) valent organopolysiloxane residue may be mentioned.

Q$^{b6}$ is an alkylene group or an alkylene group having at least 2 carbon atoms and having between carbon atom-carbon atom an etheric oxygen atom or a bivalent organopolysiloxane residue.

The number of carbon atoms in the alkylene group represented by Q$^{b6}$ is preferably from 1 to 10, particularly preferably from 2 to 6.

The number of carbon atoms in the alkylene group having at least 2 carbon atoms and having between carbon atom-carbon atom an etheric oxygen atom or a bivalent organopolysiloxane residue, represented by Q$^{b6}$, is preferably from 2 to 10, particularly preferably from 2 to 6.

Q$^{b6}$ is, in that the compound will readily be produced, preferably —CH$_2$CH$_2$—, or —CH$_2$CH$_2$CH$_2$—.

w[-Q$^{b6}$-Si(R)$_{n3}$L$_{3-n}$] may be the same or different.

As the compound (3X), in that the water/oil repellent layer will be more excellent in water/oil repellency, a compound represented by the formula (3-2) is also preferred.

[A-(OX)$_m$-Q$^a$-]$_{j32}$Z$^{32}$[-Q$^b$-Si(R)$_n$L$_{3-n}$]$_{h32}$  (3-2)

In the formula (3-2), A, X, m, Q$^a$, Q$^b$, R, and L are as defined for the respective groups in the formulae (3-1) and (3-1A).

Z$^{32}$ is a (j32+h32) valent hydrocarbon group or a (j32+h32) valent hydrocarbon group having at least 2 carbon atoms and having at least one etheric oxygen atom between carbon atoms.

Z$^{32}$ is preferably a residue having a hydroxy group removed from a polyhydric alcohol having a primary hydroxy group.

Z$^{32}$ is, in view of availability of materials, preferably a group represented by the formulae (Z-1) to (Z-5). In the formula, R$^{34}$ is an alkyl group, preferably a methyl group or an ethyl group.

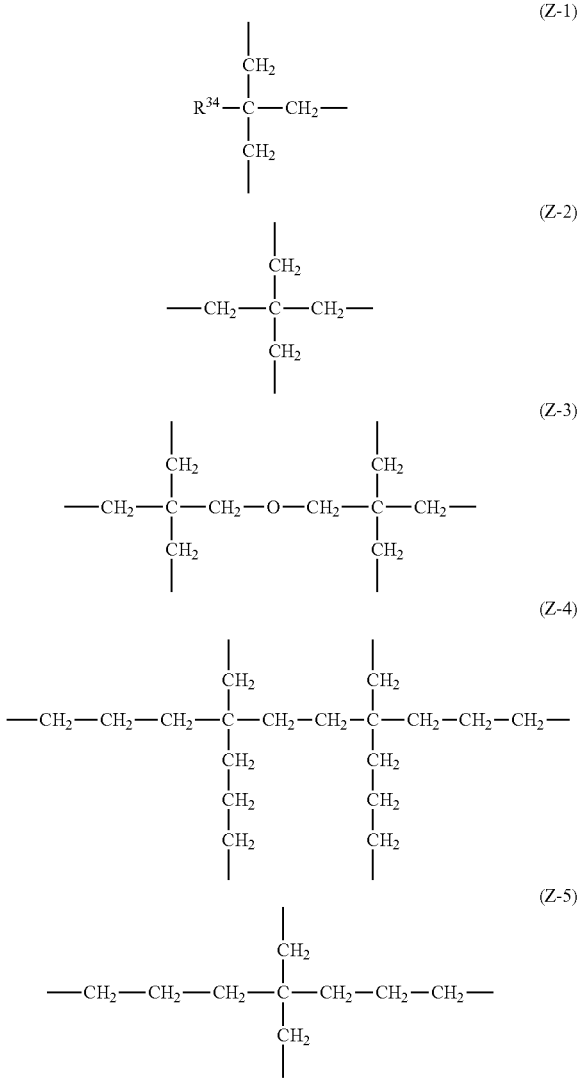

j32 is an integer of at least 2, and in that the water/oil repellent layer will be more excellent in water/oil repellency, preferably an integer of from 2 to 5.

h32 is an integer of at least 1, and in that the water/oil repellent layer will be more excellent in abrasion resistance, preferably an integer of from 2 to 4, more preferably 2 or 3.

As specific examples of the fluorinated ether compound, for example, compounds as disclosed in the following documents may be mentioned.

Perfluoropolyether-modified aminosilanes described in JP-A-H11-029585 and JP-A-2000-327772, silicon-containing organic fluorinated polymers described in Japanese Patent No. 2874715, organic silicon compounds described in JP-A-2000-144097, fluorinated siloxanes described in JP-A-2002-506887, organic silicone compounds described in JP-A-2008-534696, fluorinated modified hydrogenated polymers described in Japanese Patent No. 4138936, compounds described in U.S. Patent Application No. 2010/0129672, WO2014/126064 and JP-A-2014-070163, organosilicon compounds described in WO2011/060047 and WO2011/059430, fluorinated organosilane compounds described in WO2012/064649, fluoroxyalkylene group-containing polymers described in JP-A-2012-72272, fluorinated ether compounds described in WO2013/042732, WO2013/121984, WO2013/121985, WO2013/121986, WO2014/163004, JP-A-2014-080473, WO2015/087902, WO2017/038830, WO2017/038832, WO2017/187775, WO2018/216630, WO2019/039186, WO2019/039226, WO2019/039341, WO2019/044479, WO2019/049753, WO2019/163282 and JP-A-2019-044158, perfluoro(poly)ether-containing silane compounds described in JP-A-2014-218639, WO2017/022437, WO2018/079743 and WO2018/143433, perfluoro(poly)ether group-containing silane compounds described in WO2018/169002, fluoro(poly)ether group-containing silane compounds described in WO2019/151442, (poly)ether group-containing silane compounds described in WO2019/151445, perfluoropolyether group-containing compounds described in WO2019/098230, fluoropolyether group-containing polymer-modified silanes described in JP-A-2015-199906, JP-A-2016-204656, JP-A-2016-210854 and JP-A-2016-222859, and fluorinated compounds described in WO2019/039083 and WO2019/049754.

As commercial products of the fluorinated ether compound, KY-100 series (KY-178, KY-185, KY-195, etc.), manufactured by Shin-Etsu Chemical Co., Ltd., Afluid (registered trademark) S550 manufactured by AGC Inc., OPTOOL (registered trademark) DSX, OPTOOL (registered trademark) AES, OPTOOL (registered trademark) UF503, OPTOOL (registered trademark) UD509, etc., manufactured by DAIKIN INDUSTRIES, LTD. may, for example, be mentioned.

[Method for Producing Water/Oil Repellent Layer-Provided Substrate]

In the method for producing the water/oil repellent layer-provided substrate of the present invention, on the surface of the substrate, the undercoat layer containing an oxide containing silicon and an alkali metal is formed, and then on the surface of the undercoat layer, the water/oil repellent layer comprising a condensate of a fluorinated compound having a reactive silyl group is formed. The undercoat layer containing an oxide containing silicon and an alkali metal is formed because it is excellent in adhesion to the water/oil repellent layer.

However, if the undercoat layer contains an alkali metal, as described above, the alkali metal in the undercoat layer reacts with moisture in the atmosphere to form alkali metal ions and hydroxide ions. The hydroxide ions cleave the Si—O—Si bond at the interface between the water/oil repellent layer and the undercoat layer, and the water/oil repellent layer is peeled from the undercoat layer, and thus long-term reliability of abrasion resistance of the water/oil repellent layer will decrease.

Accordingly, in the method for producing the water/oil repellent layer-provided substrate of the present invention, after the water/oil repellent layer is formed, the water/oil repellent layer-formed side is subjected to an aqueous medium treatment to make the undercoat layer contain substantially no alkali metal.

(Formation of Undercoat Layer)

Using a material for forming undercoat layer containing a precursor of an oxide of silicon and an alkali metal source, the undercoat layer containing an oxide containing silicon and the alkali metal is formed on the surface of the substrate.

The precursor of an oxide of silicon may, for example, be silicic acid, a partially condensate of silicic acid, an alkali metal silicate, a silane compound having a hydrolyzable group bonded to the silicon atom, or a partially hydrolyzed condensate of the silane compound. Silicic acid or its partial condensate may be subjected to dehydration condensation to form an oxide of silicon, and the alkali metal silicate may be formed into silicic acid or its partial condensate by an acid or a cation exchange resin, and the formed silicic acid or its partial condensate is subjected to dehydration condensation to form an oxide of silicon. The hydrolyzable group in the silane compound having a hydrolyzable group bonded to the silicon atom may, for example, be an alkoxy group or a chlorine atom. The hydrolyzable group in the silane compound may be hydrolyzed to form a hydroxy group, and the formed silanol compound may be subjected to dehydration condensation to form an oxide of silicon. The silane compound having a hydrolyzable group bonded to the silicon atom may, for example, be an alkoxysilane such as a tetraalkoxysilane or an alkyltrialkoxysilane, or tetrachlorosilane.

The precursor of an oxide of silicon is preferably silicic acid, a partial condensate of silicic acid, tetraalkoxysilane or a partially hydrolyzed condensate of a tetraalkoxysilane.

The alkali metal source may, for example, be an alkali metal hydroxide or a water-soluble alkali metal salt. The water-soluble alkali metal salt may, for example, be an alkali metal carbonate, an alkali metal hydrogen carbonate, an alkali metal hydrochloride or an alkali metal nitrate. The alkali metal source is preferably an alkali metal hydroxide or an alkali metal carbonate.

Further, the alkali metal silicate may be used as the precursor of an oxide containing silicon and as the alkali metal source. As described above, the alkali metal silicate may be formed into the oxide of silicon via silicic acid, and on that occasion, a small amount of the alkali metal remains in the oxide of silicon formed in not a few cases. Accordingly, the amount of the remaining alkali metal may be adjusted intentionally to obtain an oxide containing predetermined amounts of the alkali metal and silicon.

As a method of forming the undercoat layer containing an oxide containing silicon and an alkali metal, the following (a1) or (a2) is preferred. The method (a1) is a method of using wet coating, and the method (a2) is a method using dry coating.

(a1): A method of forming the undercoat layer containing an oxide containing silicon and an alkali metal on the surface of the substrate using a coating fluid containing at least one silicon oxide precursor selected from the group consisting of silicic acid, a partial condensate of silicic acid, an alkoxysilane and its partially hydrolyzed condensate, and alkali metal source and a solvent.

(a2): A method of forming the undercoat layer containing an oxide of silicon and an alkali metal on the surface of the substrate by using an oxide containing an alkali metal and silicon.

(a1)

The coating fluid for forming an oxide layer containing silicon and an alkali metal preferably contains, as the precursor of an oxide containing silicon, at least one member selected from the group consisting of silicic acid and its partial condensate, in view of easy formation of the oxide layer containing silicon, and particularly preferably contains a partial condensate of silicic acid.

As the material for producing silicic acid or its partial condensate, an alkali metal silicate is preferred. By using the alkali metal silicate, alkali metal atoms at a predetermined concentration can be incorporated in the oxide layer containing silicon. Further, it is also possible to adjust the alkali metal concentration in the oxide layer containing silicon formed, by using an alkali metal source such as an alkali metal hydroxide.

Specifically, preferred is a method of subjecting an aqueous alkali metal silicate solution to deionization treatment to obtain an aqueous silicic acid solution, and adding a water-soluble organic solvent to the aqueous silicic acid solution to adjust the alkali metal concentration. By properly selecting the deionization conditions, a preferred amount of alkali metal atoms can be incorporated in the aqueous silicic acid solution. As the deionization treatment method, for example, a method of mixing the aqueous alkali metal silicate solution with a cation exchange resin, followed by stirring, and removing the cation exchange resin may be mentioned. The alkali metal silicate used in this method is preferably sodium silicate.

The alkali metal silicate may be a silicate represented by $M_2O \cdot nSiO_2$, and may, for example, be specifically a metasilicate ($M_2SiO_3$), an orthosilicate ($M_4SiO_4$), a bisilicate ($M_2Si_2O_5$) or a tetrasilicate ($M_2Si_4O_9$).

For example, the sodium silicate may be $Na_2O \cdot nSiO_2$ as specified by JIS K1408-1966, and specifically, it may be sodium metasilicate ($Na_2SiO_3$), sodium orthosilicate ($Na_4SiO_4$), sodium bisilicate ($Na_2Si_2O_5$) or sodium tetrasilicate ($Na_2Si_4O_9$).

The solvent is preferably water or a water-soluble organic solvent. The water-soluble organic solvent may, for example, be an alcohol organic solvent, a ketone organic solvent, an ether organic solvent or an ester organic solvent, and is preferably an alcohol organic solvent. The alcohol organic solvent may, for example, be isopropyl alcohol, ethanol or n-butanol.

The solid content concentration (as calculated as $SiO_2$) in the coating fluid is preferably from 0.001 to 10 mass %, particularly preferably from 0.1 to 3 mass %.

As a method of applying the coating fluid to the surface of the substrate by wet coating, spin coating method, wipe coating method, spray coating method, squeezy coating method, dip coating method, die coating method, ink-jet method, flow coating method, roll coating method, casting method, Langmuir-Blodgett method and gravure coating method may be mentioned.

After the coating fluid is applied to the surface of the substrate by wet coating to form a wet film, the solvent is removed from the wet film to make silicic acid and its partial condensate undergo condensation thereby to form a silicon oxide layer.

The temperature at the time of removing the solvent from the wet film and the temperature at the time of condensation of silicic acid and its partial condensate are preferably from 0 to 600° C., and with a view to forming a dense silicon oxide layer, particularly preferably from 200 to 600° C.

(a2)

As a method of conducting dry coating using an oxide containing an alkali metal and silicon, in view of excellence in simplicity of the process, vacuum deposition method, CVD method or sputtering method may, for example, be mentioned. In view of simplicity of the apparatus, vacuum deposition method is particularly preferred. At the time of vacuum deposition, a pellet-form substance having a metal porous body of e.g. iron or steel impregnated with the fluorinated compound or a pellet-form substance obtained by impregnating a metal porous body with the composition, followed by drying, may be used.

In a case where two or more types of oxides each containing an alkali metal and silicon are to be deposited in the vacuum deposition method, these oxides may be used as one deposition source, or may be used as separate deposition sources and subjected to co-deposition. It is particularly preferred to use one deposition source consisting of an oxide containing an alkali metal and silicon. For example, in a case where two or more types of oxide layers each containing an alkali metal and silicon are to be formed, it is preferred to use one deposition source consisting of two or more types of oxides each containing an alkali metal and silicon.

As the oxide containing an alkali metal and silicon to be used for dry coating method, such as a deposition source in the vacuum deposition method, preferred is an oxide containing an alkali metal and silicon, the content of the alkali metal being at least 200 ppm to silicon. The content of the alkali metal is, to silicon, more preferably at least 1,000 ppm, particularly preferably at least 10,000 ppm. When the content of the alkali metal is at least the lower limit value of the above range, excellent adhesion between the formed undercoat layer and the water/oil repellent layer will be achieved. The upper limit value of the content of the alkali metal is preferably 200,000 ppm to silicon, particularly preferably 100,000 ppm.

To produce the oxide containing an alkali metal and silicon, a method of adding silicon dioxide to an aqueous alkali metal source-containing solution, followed by stirring, and removing water may be mentioned. The silicon dioxide is preferably porous silicon dioxide such as silica gel. The aqueous alkali metal source-containing solution may, for example, be an aqueous alkali metal hydroxide solution or an aqueous alkali metal carbonate solution. Further, it is possible to produce the oxide containing an alkali metal and silicon from the coating fluid for forming an oxide layer containing silicon and an alkali metal in (a1).

Further, it is possible to use, as the oxide containing an alkali metal and silicon, porous silica gel containing an alkali metal, produced from an alkali metal silicate such as sodium silicate, or porous silica gel containing an alkali metal, obtained by further impregnating the porous silica gel with an aqueous solution containing an alkali metal source, followed by drying or firing. The oxide containing an alkali metal and silicon may be a commercial product, for example, porous spherical silica gel produced from sodium silicate, such as M.S. GEL (tradename, manufactured by AGC Si-Tech Co., Ltd.).

The form of the oxide containing an alkali metal and silicon is not limited, and the oxide may be in the form of a powder, beads, pellets, cullet or the like. It is preferably in the form of beads, pellets or cullet, whereby it is easy to use as a deposition source or the like. The method of producing the pellets is not limited and may, for example, be a method of subjecting a powder to powder compacting into a pellet-shaped formed product. The size of the pellet-shaped formed product is not particularly limited, however, if the pellets are small, they may fly too much at the time of coating, and accordingly, for example, the diameter is preferably at least 1 cm. As the method of producing cullet, a method of cutting by a cutter or grinding glass having calcium added.

(Formation of Water/Oil Repellent Layer)

The water/oil repellent layer may be formed either by dry coating or wet coating, using a fluorinated compound or a composition containing a fluorinated compound and a liquid medium (hereinafter sometimes referred to as "composition").

As specific examples of the liquid medium contained in the composition, water and an organic solvent may be mentioned. As specific examples of the organic solvent, a fluorinated organic solvent and a non-fluorinated organic solvent may be mentioned. The organic solvents may be used alone or in combination of two or more.

As specific examples of the fluorinated organic solvent, a fluorinated alkane, a fluorinated aromatic compound, a fluoroalkyl ether, a fluorinated alkylamine and a fluoroalcohol may be mentioned.

The fluorinated alkane is preferably a compound having 4 to 8 carbon atoms, and may, for example, be $C_6F_{13}H$ (AC-2000, trade name, manufactured by AGC Inc.), $C_6F_{13}C_2H_5$ (AC-6000, trade name, manufactured by AGC Inc.), or $C_2F_5CHFCHFCF_3$ (Vertrel, trade name, manufactured by DuPont).

As specific examples of the fluorinated aromatic compound, hexafluorobenzene, trifluoromethylbenzene, perfluorotoluene, 1,3-bis(trifluoromethyl)benzene, and 1,4-bis(trifluoromethyl)benzene may be mentioned.

The fluoroalkylether is preferably a compound having from 4 to 12 carbon atoms, and may, for example, be $CF_3CH_2OCF_2CF_2H$ (AE-3000, trade name, manufactured by AGC Inc.), $C_4F_9OCH_3$ (Novec-7100, trade name, manufactured by 3M), $C_4F_9OC_2H_5$ (Novec-7200, trade name, manufactured by 3M), and $C_2F_5CF(OCH_3)C_3F_7$ (Novec-7300, trade name, manufactured by 3M).

As specific examples of the fluorinated alkylamine, perfluorotripropylamine and perfluorotributylamine may be mentioned.

As specific examples of the fluoroalcohol, 2,2,3,3-tetrafluoropropanol, 2,2,2-trifluoroethanol and hexafluoroisopropanol may be mentioned.

The non-fluorinated organic solvent is preferably a compound consisting solely of hydrogen atoms and carbon atoms, or a compound consisting solely of hydrogen atoms, carbon atoms and oxygen atoms, and may be specifically a hydrocarbon organic solvent, a ketone organic solvent, an ether organic solvent, an ester organic solvent or an alcohol organic solvent.

As specific examples of the hydrocarbon organic solvent, hexane, heptane and cyclohexane may be mentioned.

As specific examples of the ketone organic solvent, acetone, methyl ethyl ketone and methyl isobutyl ketone may be mentioned.

As specific examples of the ether organic solvent, diethyl ether, tetrahydrofuran and tetraethylene glycol dimethyl ether may be mentioned.

As specific examples of the ester organic solvent, ethyl acetate and butyl acetate may be mentioned.

As specific examples of the alcohol organic solvent, isopropyl alcohol, ethanol and n-butanol may be mentioned.

The content of the fluorinated compound in the composition is, to the total mass of the composition, preferably from 0.01 to 50 mass %, particularly preferably from 1 to 30 mass %.

The content of the liquid medium in the composition is, to the total mass of the composition, preferably from 50 to 99.99 mass %, particularly preferably from 70 to 99 mass %.

The water/oil repellent layer may be produced, for example, by the following method.

A method of treating the surface of the undercoat layer by dry coating method using the fluorinated compound or the composition, to form the water/oil repellent layer on the surface of the undercoat layer.

A method of applying the composition to the surface of the undercoat layer by wet coating method, followed by drying to form the water/oil repellent layer on the surface of the undercoat layer.

As specific examples of the dry coating method, vacuum deposition method, CVD method and sputtering method may be mentioned. Among them, with a view to suppressing decomposition of the fluorinated compound and in view of simplicity of the apparatus, vacuum deposition method is preferred. At the time of vacuum deposition, a pellet-form substance having a metal porous body of e.g. iron or steel supporting the fluorinated compound or a pellet-form substance obtained by impregnating a metal porous body with the composition, followed by drying, may be used.

As specific examples of the wet coating method, spin coating method, wipe coating method, spray coating method, squeeze coating method, dip coating method, die coating method, ink-jet method, flow coating method, roll coating method, casting method, Langmuir-Blodgett method and gravure coating method may be mentioned.

The drying temperature after applying the composition by wet coating is preferably from 20 to 200° C., particularly preferably from 80 to 160° C.

In order to improve abrasion resistance of the water/oil repellent layer, as the case requires, an operation to accelerate the reaction between the fluorinated compound having a reactive silyl group and the undercoat layer may be conducted. Such an operation may, for example, be heating, humidification or light irradiation. For example, the undercoat layer-provided substrate having a water/oil repellent layer formed thereon may be heated in the air containing moisture to accelerate e.g. hydrolysis of the reactive silyl group into a silanol group, formation of a siloxane bond by condensation reaction of the silanol groups, or condensation reaction of the silanol group on the surface of the undercoat layer and the silanol group of the fluorinated compound.

After the surface treatment, the compound in the water/oil repellent layer, which is not chemically bonded to other compound or the silicon oxide layer, may be removed as the case requires. As a specific method, for example, a method of rinsing the water/oil repellent layer with a solvent, a method of wiping the water/oil repellent layer with cloth impregnated with a solvent, or a method of washing the surface of the water/oil repellent layer with an acid may be mentioned.

(Aqueous Medium Treatment)

As a method of the aqueous medium treatment on the water/oil repellent layer-formed side, a method of washing the water/oil repellent layer-formed side with an aqueous solution of an acid, or a method of dipping the water/oil repellent layer-formed side in the aqueous solution of an acid may be mentioned. The acid may be an inorganic acid such as nitric acid, sulfuric acid, phosphoric acid or hydrochloric acid, or an organic acid such as an organic carboxylic acid (such as ascorbic acid or citric acid) or an organic phosphonic acid, but is not limited thereto. Further, in a case where the inorganic acid is used, to prevent pH fluctuations, together with the inorganic acid, a salt of the acid may be added. Further, a method of washing the water/oil repellent layer-formed side with pure water or a method of dipping the water/oil repellent layer-formed side in pure water, instead of an aqueous solution of the acid, may be mentioned.

The aqueous medium treatment is preferably a washing treatment with an aqueous solution of an acid or a dipping treatment in an aqueous solution of an acid. The acid may be the following inorganic acid or organic acid. The inorganic acid may be nitric acid, sulfuric acid or hydrochloric acid. Hydrochloric acid is not preferred since it corrodes the silicon oxide layer. The organic acid may be an organic carboxylic acid such as ascorbic acid or citric acid, or an organic phosphonic acid. Such inorganic acids and organic acids may be used alone or as a mixture. Further, in a case where the inorganic acid is used, to prevent pH fluctuations, together with the inorganic acid, a salt of the acid may be added. The aqueous acid solution has a pH of preferably from 1 to 3. The washing or dipping time is preferably from 1 minute to 1 hour.

EXAMPLES

Now, the present invention will be described in further detail with reference to Examples. However, it should be understood that the present invention is by no means restricted thereto. Ex. 1, 2, 6 to 9 and 11 to 14 are Examples of the present invention, and Ex. 3 to 5 and 10 are Comparative Examples.

[Physical Properties and Evaluation]
(Alkali Deficiency Index)

By X-ray photoelectron spectroscopy (XPS) by $C_{60}$ ion sputtering, a depth profile was prepared taking the total concentration of fluorine, silicon, aluminum, sodium, potassium and oxygen as 100 at % from the side of the surface of the water/oil repellent layer. As the horizontal axis of the depth profile, the depth calculated as a thermally oxidized film ($SiO_2$ film) having a known thickness on a silicon wafer, which was calculated from the preliminarily obtained sputtering rate of the thermally oxidized film ($SiO_2$ film) on a silicon wafer. The measurement interval of the depth profile was 2.0 nm or shorter as the depth calculated as the thermally oxidized film ($SiO_2$ film) on a silicon wafer. The measurement apparatus and measurement conditions are as follows.

<Apparatus>
X-ray photoelectron spectroscope: ESCA-5500 manufactured by ULVAC-PHI, Inc.

<Measurement Conditions>
X-ray source: monochromatized AlKα ray
Photoelectron detection angle: 75 degrees to sample surface
Pass energy: 117.4 eV
Step energy: 0.5 eV/step
Sputter ion: $C_{60}$ ion with accelerating voltage of 10 kV
Raster size of sputtering gun: 3×3 mm$^2$
Photoelectron peaks monitored: F1s, Si2p, Al2p, Na2s, K2s, O1s In the depth profile taking the total concentration of fluorine, silicon, aluminum, sodium, potassium and oxygen as 100 at %, the point at which the fluorine concentration becomes 10 at % or lower for the first time (point A) was taken as the boundary between the water/oil repellent layer and the undercoat layer.

From the depth profile taking the total concentration of fluorine, silicon, aluminum, sodium, potassium and oxygen as 100 at %, the proportion of aluminum to silicon (Al/Si) and the total proportion of sodium and potassium to silicon ((Na+K)/Si) were obtained, and based on the average values of the values of (Al/Si) and the values of ((Na+K)/Si) in a region at a depth of at least 70.0 nm and at most 80.0 nm respectively being 1, the (Al/Si) and ((Na+K)/Si) values at the respective positions in the depth direction were normalized.

The point at which the normalized (Al/Si) value becomes 0.50 (point B) was taken as the boundary between the undercoat layer and the substrate, and the depth from the point A to the point B was taken as the thickness of the undercoat layer.

The region from the point B as the origin up to 20 nm in the depth direction from the origin was taken as the region X, and the alkali deficiency index in the region X defined by the following formula was obtained:

alkali deficiency index=[(average value of normalized Al/Si in the region X)−(average value of normalized(Na+K)/Si in the region X)]×20

(Abrasion Resistance 1)

With respect to the water/oil repellent layer stored in an environment at a temperature of 30° C. under a humidity of 70% for one week, after abrasion with steel wool for 4,000 reciprocations in accordance with JIS L0849: 2013 (ISO 105-X12: 2001) using a reciprocating traverse testing machine (manufactured by KNT Co.), wherein steel wool BON STAR (yarn number: #0000, dimensions: 5 mm×10 mm×10 mm) was reciprocated under a load of 9.8N at a rate of 80 rpm, the water contact angle of the water/oil repellent layer was measured, and the abrasion resistance was evaluated in accordance with the following evaluation standards. The smaller the decrease in the water contact angle after abrasion, the smaller the decrease in performance due to abrasion, and the more excellent the abrasion resistance.

⊚: Water contact angle of at least 105°
○: Water contact angle of at least 100° and less than 105°
x: Water contact angle of less than 1000

(Abrasion Resistance 2)

Conducted in the same manner as for evaluation of abrasion resistance 1, except that the number of reciprocations was 16,000.

⊚: Water contact angle of at least 100°
○: Water contact angle of at least 90° and less than 100°
Δ: Water contact angle of at least 80° and less than 90°
x: Water contact angle of less than 80°

[Preparation of Fluorinated Compound]

Preparation Example 1

Compound (3A) was obtained with reference to the method for producing compound (ii-2) described in WO2014/126064.

CF$_3$CF$_2$—OCF$_2$CF$_2$—(OCF$_2$CF$_2$CF$_2$CF$_2$OCF$_2$CF$_2$)$_n$—OCF$_2$CF$_2$CF$_2$—C(O)NH—CH$_2$CH$_2$CH$_2$—Si(OCH$_3$)$_3$ (3A)

Average of number n of units: 13, number average molecular weight of compound (3A): 4,920

Preparation Example 2

Compound (1-1A) was obtained in accordance with the method described in Ex. 3 of WO2017/038832.

CF$_3$—(OCF$_2$CF$_2$—OCF$_2$CF$_2$CF$_2$CF$_2$)$_{x3}$(OCF$_2$CF$_2$)—OCF$_2$CF$_2$CF$_2$—CH$_2$—N[CH$_2$CH$_2$CH$_2$—Si(OCH$_3$)$_3$]$_2$ (1-1A)

Average of number ×3 of units: 13, Mn of compound (1-1A): 5,020

Preparation Example 3

Compound (1-1B) was obtained in accordance with the method described in Ex. 11 of WO2017/038830.

CF$_3$—(OCF$_2$CF$_2$OCF$_2$CF$_2$CF$_2$CF$_2$)$_n$(OCF$_2$CF$_2$)—OCF$_2$CF$_2$CF$_2$—C(O)NH—CH$_2$—C[CH$_2$CH$_2$CH$_2$—Si(OCH$_3$)$_3$]3 (1-1B)

Average of number n of units: 13, Mn of compound (1-1B): 5,400

Compound (1-2B) was prepared as follows.

In a reactor the interior of which was replaced with nitrogen, 21.8 g of NaH weighed in a box the interior of which was replaced with nitrogen was charged to 100 g of dehydrated THE (tetrahydrofuran), followed by stirring in an ice bath, and 40 g of a 50 mass % malononitrile solution having malononitrile dissolved in dehydrated THE was added, and then 80.6 g of allyl bromide was added, followed by stirring in an ice bath for 4 hours. Diluted aqueous hydrochloric acid solution was added and the reaction was terminated, followed by washing with water and a saturated salt solution, and an organic phase was recovered. The recovered solution was concentrated by an evaporator to obtain a crude product. The crude product was subjected to silica gel column chromatography to obtain 42 g of compound (X5-1).

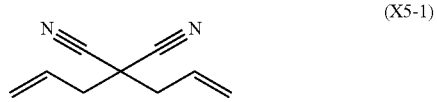
(X5-1)

Into an eggplant flask having a capacity of 300 mL, the interior of which was replaced with nitrogen, 31.1 g of LiAlH4 and 100 g of dehydrated THE were added, followed by stirring in an ice bath until the temperature reached 0° C. 40 g of compound (X5-1) was slowly added dropwise. Disappearance of compound (X5-1) was confirmed by thin layer chromatography, and to the reaction crude liquid, Na$_2$SO$_4$·10H$_2$O was slowly added for quenching, followed by filtration with celite, and by washing with water and a saturated salt solution. The recovered organic layer was distilled under reduced pressure and purified by column chromatography to obtain 32.5 g of compound (X5-2).

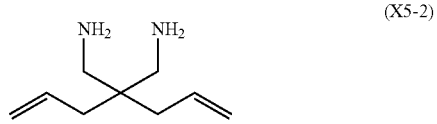
(X5-2)

Into a 50 mL eggplant flask, 0.4 g of compound (X5-2) and 27 g of CF$_3$(OCF$_2$CF$_2$OCF$_2$CF$_2$CF$_2$CF$_2$)$_{13}$OCF$_2$CF$_2$OCF$_2$CF$_2$CF$_2$—C(O)—CH$_3$ were added, followed by stirring for 12 hours. It was confirmed by NMR that compound (X5-2) was entirely converted to compound (X5-3). Further, methanol was formed as a by-product. The obtained solution was diluted with 9.0 g of AE-3000 and purified by silica gel column chromatography (developing solvent: AE-3000) to obtain 16.3 g (yield: 66%) of compound (X5-3).

In the following formula, PFPE means

CF$_3$(OCF$_2$CF$_2$OCF$_2$CF$_2$CF$_2$CF$_2$)$_{13}$OCF$_2$CF$_2$OCF$_2$CF$_2$CF$_2$—.

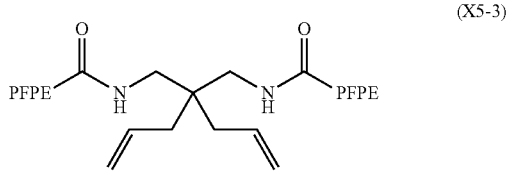
(X5-3)

Into a 100 mL PFA eggplant flask, 5.0 g of compound (X5-3), 0.5 g of a xylene solution (platinum content: 2%) of platinum/1,3-divinyl-1,1,3,3-tetramethyldisiloxane complex, 0.3 g of $HSi(OCH_3)_3$, 0.02 g of dimethyl sulfoxide and 5.0 g of 1,3-bis(trifluoromethyl)benzene (manufactured by Tokyo Chemical Industry Co., Ltd.) were put, followed by stirring at 40° C. for 10 hours. After completion of the reaction, the solvent and the like were distilled off under reduced pressure, and the residue was subjected to filtration through a membrane filter having a pore size of 0.2 μm to obtain compound (1-2B) having two allyl groups of compound (X5-3) hydrosilylated. The degree of conversion of hydrosilylation was 100%, and no compound (X5-3) remained.

In the following formula, PFPE means

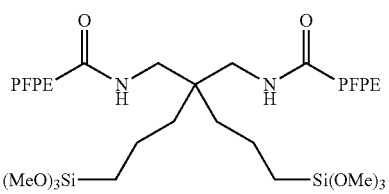
(1-2B)

Mn of compound (1-2B): 9,800

Preparation Example 5

Mixture (M1) containing the following compounds (1-3A) and (1-1 D) was prepared as follows.

Preparation Example 5-1

Compound (X6-1) was obtained in accordance with the method described in Ex. 1-1 of WO2013-121984.

(X6-1)

Preparation Example 5-2

Into a 200 mL eggplant flask, 16.2 g of $HO-CH_2CF_2CF_2CH_2-OH$ and 13.8 g of potassium carbonate were put, followed by stirring at 120° C., and 278 g of compound (X4-1) was added, followed by stirring at 120° C. for 2 hours. The temperature was returned to 25° C., and 50 g of AC-2000 (trade name, manufactured by AGC Inc., $C_6F_{13}H$) and 50 g of hydrochloric acid were put, followed by liquid separation, and the resulting organic phase was concentrated. The obtained reaction crude liquid was purified by column chromatography to obtain 117.7 g (yield: 40%) of compound (X6-2).

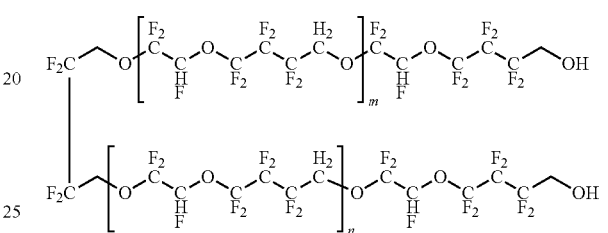
(X6-2)

NMR spectrum of compound (X6-2):
$^1$H-NMR (300.4 MHz, solvent: $CDCl_3$, reference: tetramethylsilane (TMS)) δ(ppm): 6.0(12H), 4.6(20H), 4.2(4H), 4.1(4H).
$^{19}$F-NMR (282.7 MHz, solvent: $CDCl_3$, reference: $CFCl_3$) δ(ppm): −85(24F), −90(24F), −120(20F), −122(4F), −123(4F), −126(24F), −144(12F)

Average of number m+n of units: 10

Preparation Example 5-3

Into a 50 mL eggplant flask to which a reflux condenser was connected, 20 g of compound (X6-2) obtained in Preparation Example 5-2, 2.4 g of a sodium fluoride powder, 20 g of AC-2000 and 18.8 g of $CF_3CF_2CF_2OCF(CF_3)COF$ were added. In a nitrogen atmosphere, the content in the flask was stirred at 50° C. for 24 hours. The system was cooled to room temperature, the sodium fluoride powder was removed by a pressure filter, and excess $CF_3CF_2CF_2OCF(CF_3)COF$ and AC-2000 were distilled off under reduced pressure to obtain 24 g (yield: 100%) of compound (X6-3)

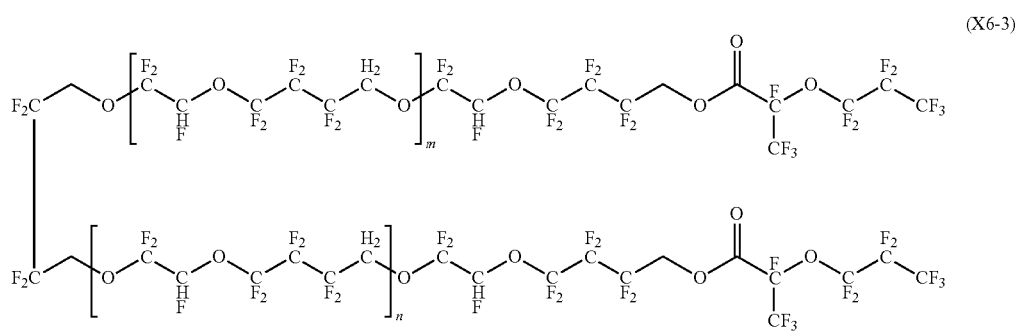
(X6-3)

NMR spectrum of compound (X6-3):
¹H-NMR (300.4 MHz, solvent: CDCl₃, reference: tetramethylsilane (TMS)) δ(ppm): 6.0(12H), 5.0(4H), 4.6(20H), 4.2(4H).
¹⁹F-NMR (282.7 MHz, solvent: CDCl₃, reference: CFCl₃) δ(ppm): −79(4F), −81(6F), −82(6F), −85(24F), −90(24F), −119(4F), −120(20F), −122(4F), −126(24F), −129(4F), −131(2F), −144(12F).
Average of number m+n of units: 10.

Preparation Example 5-4

Into a 500 mL nickel reactor, 250 mL of ClCF₂CFClCF₂OCF₂CF₂Cl (hereinafter referred to as "CFE-419") was put, followed by bubbling with nitrogen gas. After the oxygen gas concentration was sufficiently lowered, bubbling with 20 vol % fluorine gas diluted with nitrogen gas was conducted for 1 hour. A CFE-419 solution (concentration: 10 mass %, compound (X6-3): 24 g) of compound (X6-3) obtained in Preparation Example 5-3 was charged over a period of 6 hours. The ratio of the rate (mol/hour) of introduction of fluorine gas to the rate (mol/hour) of introduction of hydrogen atoms in the compound (X6-3) was controlled to be 2:1. After the charge of the compound (X6-3) was completed, a CFE-419 solution of benzene (concentration: 0.1 mass %, benzene: 0.1 g) was intermittently charged. After completion of the charge of the benzene, bubbling with fluorine gas was conducted for one hour, and finally, the system in the reactor was sufficiently replaced with nitrogen gas. The solvent was distilled off to obtain 25.3 g (yield: 90%) of compound (X6-4).

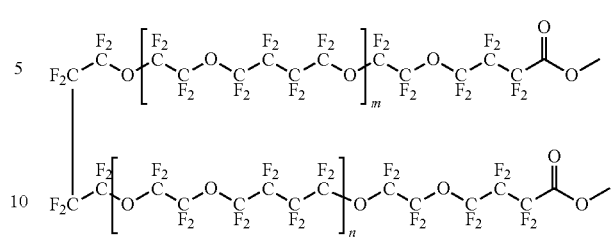

(X6-5)

NMR spectrum of compound (X6-5):
¹H-NMR (300.4 MHz, solvent: CDCl₃, reference: tetramethylsilane (TMS)) δ(ppm): 4.2(6H).
¹⁹F-NMR (282.7 MHz, solvent: CDCl₃, reference: CFCl₃) δ(ppm): −83(44F), −87(44F), −119(4F), −124(44F).
Average of number m+n of units: 10

Preparation Example 5-6

Into a 50 mL eggplant flask, 15 of compound (X6-5) obtained in Preparation Example 5-5, 3.2 g of H₂NCH₂C(CH₂CH=CH₂)₃ and 15 mL of AC-2000 were put, followed by stirring at 0° C. for 24 hours. The reaction crude liquid was purified by column chromatography to obtain three fractions each containing the desired product. 11.2 g (yield: 70%) of compound (X6-6) was obtained in total. The respective three fractions are taken as (C4-6a), (C4-6b) and (C4-6c). The fraction (C4-6c) was again purified by column chromatography to obtain fraction (C4-6d).

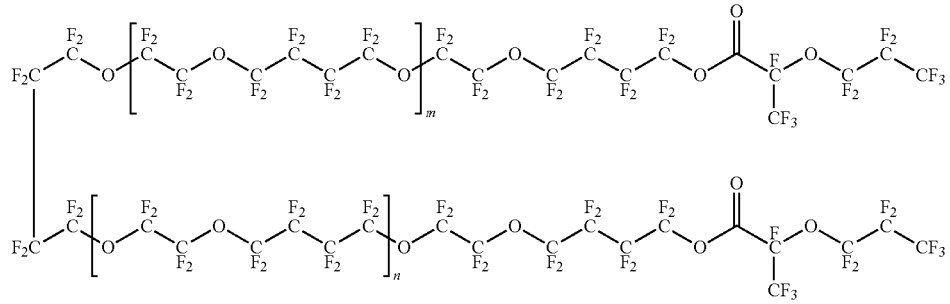

(X6-4)

NMR spectrum of compound (X6-4):
¹⁹F-NMR (282.7 MHz, solvent: CDCl₃, reference: CFCl₃) δ(ppm): −79(4F), −81(6F), −82(6F), −83(48F), −87(44F), −124(48F), −129(4F), −131(2F).
Average of number m+n of units: 10

Preparation Example 5-5

Into a 50 mL eggplant flask, 25.3 g of compound (X6-4) obtained in Preparation Example 5-4, 2.2 g of sodium fluoride and 25 mL of AC-2000 were put, followed by stirring in an ice bath. 1.7 g of methanol was put, followed by stirring at 25° C. for 1 hour. After filtration, the filtrate was purified by column chromatography. 15 g (yield: 80%) of compound (X6-5) was obtained.

The fractions (C4-6a) to (C4-6c) contained compounds (X6-6) and (X6-7). Using the respective fractions, the ratio (CF₃/CF₂) was obtained by ¹⁹F-NMR. CF₃ in the ratio means the number of moles of the —CF₃ group present at one terminal of compound (X6-7) (—CF₃ group surrounded by the dotted line in the formula), and is observed at −85 to −87 ppm in the ¹⁹F-NMR spectrum. Further, CF₂ in the ratio means the total number of moles of the —CF₂— group present in the vicinity of one terminal of compound (X6-7) (—CF₂— group surrounded by the dotted line in the formula) and the —CF₂— groups present in the vicinity of both terminals of compound (X6-6) (—CF₂— groups surrounded by dotted line in the formula), and is observed at −120 ppm in the ¹⁹F-NMR spectrum. It was confirmed that no compound (X6-7) was detected in the fraction (C4-6d).

CF₃/CF₂ in the fraction(C4-6a)=0.11

CF₃/CF₂ in the fraction(C4-6b)=0.06

CF₃/CF₂ in the fraction(C4-6c)=0.05

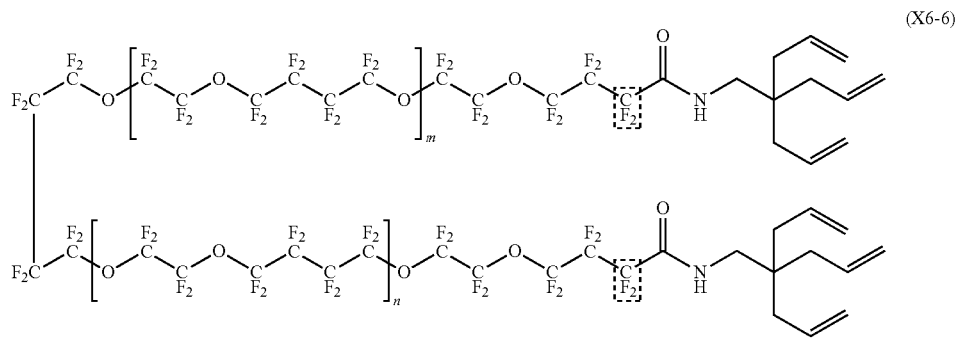

(X6-6)

NMR spectrum of compound (X6-6):
$^1$H-NMR (300.4 MHz, solvent: CDCl$_3$, reference: tetramethylsilane (TMS)) δ(ppm): 6.1(6H), 5.2(12H), 3.4(4H), 2.1(12H).

$^{19}$F-NMR (282.7 MHz, solvent: CDCl$_3$, reference: CFCl$_3$) δ(ppm): −83(44F), −87(44F), −120(4F), −124(44F).

Average of number m+n of units: 10

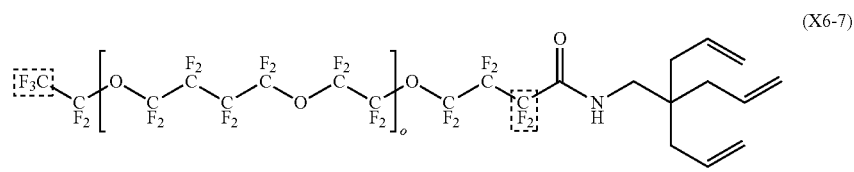

(X6-7)

Preparation Example 5-7

Into a 50 mL eggplant flask, 1 g of fraction (C4-6a) obtained in Preparation Example 5-6, 0.21 g of trimethoxysilane, 0.001 g of aniline, 1.0 g of AC-6000 and 0.0033 g of platinum/1,3-divinyl-1,1,3,3-tetramethyldisiloxane complex were put, followed by stirring at 25° C. overnight. The solvent and the like were distilled off under reduced pressure to obtain 1.2 g (yield: 100%) of mixture (M1).

Mixture (M1) contained compounds (1-1D) and (1-3A).
Using mixture (M1), by $^{19}$F-NMR, the ratio (CF$_3$/CF$_2$) was obtained in the same manner as in Preparation Example 5-6. The groups surrounded by the dotted line in the formulae are groups to be measured by $^{19}$F-NMR.

CF$_3$/CF$_2$ in the mixture (M1)=0.11

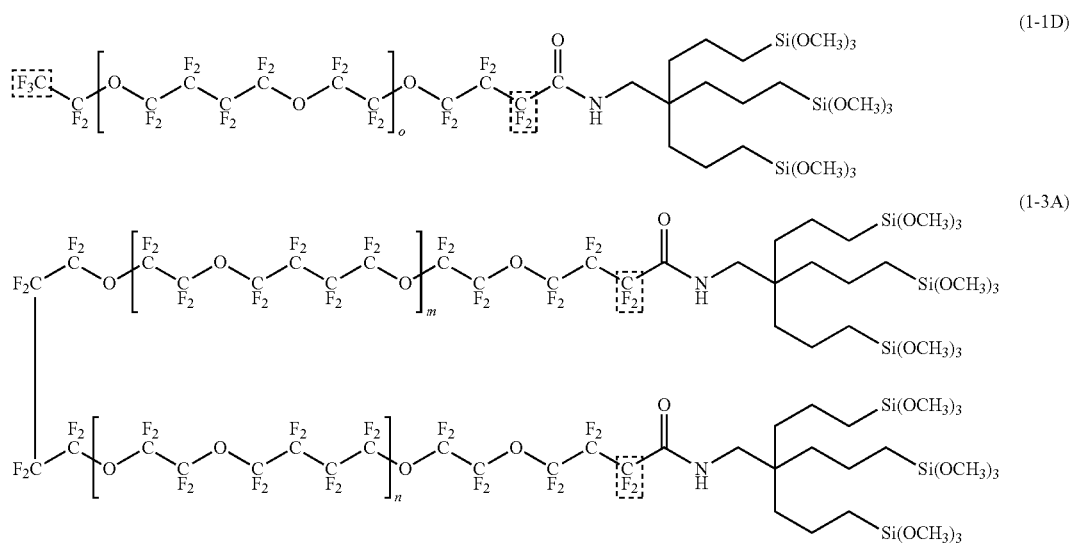

NMR spectrum of compound (1-3A):

$^1$H-NMR (300.4 MHz, solvent: CDCl$_3$, reference: tetramethylsilane (TMS)) δ(ppm): 3.6(54H), 3.4(4H), 1.3(24H), 0.9(12H).

$^{19}$F-NMR (282.7 MHz, solvent: CDCl$_3$, reference: CFCl$_3$) δ(ppm): −83(44F), −87(44F), −120(4F), −124(44F).

Average of number m+n of units: 10, Mn of compound (1-3A): 5,200

In the same manner as in Preparation Example 5-7, using the fraction (C4-6d) as the material, compound (1-4A) differing in the molecular weight from compound (1-3A) was obtained. Of compound (1-4A), peaks at −85 to −87 ppm were not detected in $^{19}$F-NMR.

Average of number m+n of units: 9, Mn of compound (1-4A): 4,900

A mixture containing 50 mass % each of compound (1-3A) and compound (1-1B) is taken as mixture (M$_4$). A mixture containing 30 mass % of compound (1-11B) and 70 mass % of compound (1-31B) is taken as mixture (M5).

Preparation Example 6

In accordance with Example 4 in JP-A-2015-199906, compound (1-3B) was obtained.

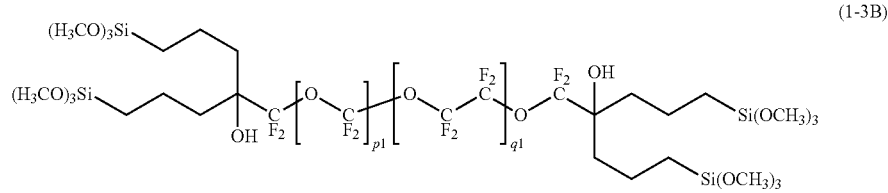

(1-3B)

In the above formula (1-3B), p1: q1≈47:53, p1+q1≈43. Mn of compound (1-3B): 4,800

Ex. 1

Into Eirich Intensive Mixer EL-1 (manufactured by Nippon Eirich Co., Ltd.), 17.36 g of soda ash (manufactured by Soda Ash Japan Co., Ltd.) and 243.66 g of silica particles SC5500-SQ (tradename, manufactured by Admatechs Company Limited) were added, followed by stirring and mixing at 2,400 rpm for 30 seconds. The stirring rate was changed to 4,800 rpm, and 39 g of distilled water was added with stirring, followed by stirring at 4,800 rpm for 60 seconds. Finally, stirring was conducted at 900 rpm for 5 minutes. The obtained particles were taken out from EL-1 and dried at 150° C. for 30 minutes and further fired at 1,150° C. for 1 hour to obtain sintered body 1.

On molybdenum boats in a vacuum deposition apparatus (manufactured by ULVAC KIKO Inc., VTR-350M), 10 g of the sintered body 1 and 0.5 g of compound (3A) as deposition materials (deposition source) were disposed. In the vacuum deposition apparatus, aluminosilicate glass containing an alkali metal element, chemically tempered with a molten salt of potassium nitrate (manufactured by AGC Inc., Dragontrail (registered trademark)) was disposed as a glass substrate, and the vacuum deposition apparatus was evacuated of air until the pressure became 5×10$^{-3}$ Pa or lower.

On the boat on which the sintered body 1 was placed was heated to 2,000° C. so that the sintered body 1 was vacuum-deposited on the glass substrate to form an undercoat layer having a thickness of 10 nm.

Further, the boat on which the compound (3A) was placed was heated to 700° C. so that the compound (3A) was vacuum-deposited on the surface of the undercoat layer to form a water/oil repellent layer having a thickness of 10 nm. The water/oil repellent layer formed was subjected to heat treatment at 140° C. for 30 minutes, and the water/oil repellent layer-formed side was subjected to dipping treatment in an aqueous nitric acid solution having a pH of 2 at room temperature for 10 minutes.

The average value of the fluorine concentrations in the water/oil repellent layer, including the point A (the point to be the boundary between the water/oil repellent layer and the undercoat layer), was 37 at %.

Ex. 2

The same operation as in Ex. 1 was conducted except that the dipping treatment time in an aqueous nitric acid solution was 30 minutes. The average value of the fluorine concentrations in the water/oil repellent layer was 36 at %.

Ex. 3

The same operation as in Ex. 1 was conducted except that no dipping treatment in an aqueous nitric acid solution was conducted. The average value of the fluorine concentrations in the water/oil repellent layer was 36 at %.

Ex. 4

On molybdenum boats in a vacuum deposition apparatus (manufactured by ULVAC KIKO, Inc., VTR-350M), 30 g of silicon oxide (manufactured by Canon Optron, Inc.) and 5 g of compound (3A) as deposition materials (deposition source) were disposed. In the vacuum deposition apparatus, a glass substrate comprising chemically tempered aluminosilicate glass containing sodium and potassium (manufactured by Corning Incorporated, Gorilla Glass 3 (registered trademark)) was disposed, and the vacuum deposition apparatus was evacuated of air until the pressure became 5×10$^{-3}$ Pa or lower.

The boat on which silicon oxide was placed was heated to 2,000° C. so that the silicon oxide was vacuum-deposited on the glass substrate to form an undercoat layer having a thickness of 10 nm.

Further, the boat on which the compound (3A) was placed was heated to 700° C. so that the compound (3A) was vacuum-deposited on the surface of the undercoat layer to form a water/oil repellent layer having a thickness of 10 nm. After formation of the water/oil repellent layer, heat treatment at 140° C. for 30 minutes was conducted, and no dipping treatment in an aqueous nitric acid solution was conducted. The average value of the fluorine concentrations in the water/oil repellent layer was 38 at %.

Ex. 5

A water/oil repellent layer was formed in the same manner as in Ex. 4, and heat treatment at 140° C. for 30 minutes was conducted, and then dipping treatment in an aqueous nitric acid solution was conducted for 30 minutes in the same manner as in Ex. 2. The average value of the fluorine concentrations in the water/oil repellent layer was 37 at %.

Ex. 6 to 9 and 11 to 14

The dipping treatment in an aqueous nitric acid solution was conducted for 30 minutes in the same manner as in Ex. 2 except that the fluorinated compound was changed to the compound or mixture as identified in Table 1.

Ex. 10

A sample was prepared in the same manner as in Ex. 4 except that the fluorinated compound was changed to the compound (1-4A).

for exterior member other than the display portion). In addition, a decorative building material for restroom, bathroom, lavatory, kitchen and the like, a waterproof member for a wiring board, a water repellent/waterproof/water sliding member of a heat exchanger, a water repellent member of a solar cell, a waterproof/water repellent member of a printed wiring board, a waterproof/water repellent member of an electronic equipment casing or an electronic member, an insulating property-improving member of a power transmission line, a waterproof/water repellent member of a filter, a waterproof member of an electromagnetic wave absorption material or an acoustic material, an antifouling member for bathroom, kitchen instrument and toiletry, a surface low-friction member of a vibrating strainer or the inside of a cylinder, a surface protective member of a machine component, a vacuum apparatus component, a bearing component, a member for a transport such as an automobile, an industrial tool, etc. may be mentioned.

TABLE 1

| Ex. | Fluorinated compound | Acid dipping treatment time (min) | Point A (nm) | Point B (nm) | Thickness of undercoat layer (nm) | Average value of Al/Si in region X | Average value of (Na + K)/Si in region X | Alkali deficiency index | Abrasion resistance 1 | Abrasion resistance 2 |
|---|---|---|---|---|---|---|---|---|---|---|
| Ex. 1 | 3A | 10 | 1.8 | 10.8 | 9.0 | 0.88 | 0.84 | 0.8 | ○ | |
| Ex. 2 | 3A | 30 | 1.9 | 11.4 | 9.5 | 0.85 | 0.72 | 2.6 | ⊚ | X |
| Ex. 3 | 3A | 0 | 1.6 | 11.2 | 9.6 | 0.82 | 1.10 | −5.6 | X | |
| Ex. 4 | 3A | 0 | 1.6 | 9.6 | 8.0 | 0.79 | 0.87 | −1.6 | X | |
| Ex. 5 | 3A | 30 | 1.6 | 9.6 | 8.0 | 0.83 | 0.86 | −0.6 | X | |
| Ex. 6 | 1-1A | 30 | 1.7 | 11.9 | 10.2 | 0.82 | 0.70 | 2.4 | ⊚ | ○ |
| Ex. 7 | 1-1B | 30 | 1.7 | 11.9 | 10.2 | 0.83 | 0.70 | 2.6 | ⊚ | ○ |
| Ex. 8 | 1-2B | 30 | 1.7 | 11.9 | 10.2 | 0.84 | 0.73 | 2.2 | ⊚ | Δ |
| Ex. 9 | 1-4A | 30 | 1.7 | 10.2 | 8.5 | 0.83 | 0.75 | 1.6 | ○ | ○ |
| Ex. 10 | 1-4A | 0 | 1.7 | 10.2 | 8.5 | 0.80 | 0.85 | −1.0 | X | X |
| Ex. 11 | 1-3B | 30 | 1.8 | 10.8 | 9.0 | 0.87 | 0.79 | 1.6 | ○ | ○ |
| Ex. 12 | M1 | 30 | 1.8 | 10.8 | 9.0 | 0.83 | 0.74 | 1.8 | ○ | ⊚ |
| Ex. 13 | M4 | 30 | 1.8 | 10.8 | 9.0 | 0.84 | 0.74 | 2.0 | ⊚ | ⊚ |
| Ex. 14 | M5 | 30 | 1.8 | 10.8 | 9.0 | 0.81 | 0.71 | 2.0 | ⊚ | ⊚ |

As shown in Table 1, the water/oil repellent layer-provided substrate with an alkali deficiency index of higher than 0.0 had improved long-term reliability of abrasion resistance.

INDUSTRIAL APPLICABILITY

The water/oil repellent layer-provided substrate of the present invention is useful for various applications for which it is required to impart water/oil repellency. For example, it may be used for a display input device such as a touch panel, a transparent glass or transparent plastic member, a lens of eyeglasses or the like, a kitchen antifouling member, a water repellent moistureproof member or antifouling member of electronic device, a heat exchanger or a battery, a toiletry antifouling member, a member which requires liquid repellency while conducting electricity, a water repellent/waterproof/water sliding member of a heat exchanger, or a surface low-friction member for a vibrating strainer or the inside of a cylinder, etc. More specific examples of application include a front protective plate, an antireflection plate, a polarizing plate, an antiglare plate or a surface thereof having an antireflection film, of a display, an apparatus having a display input device of which the screen is operated by human fingers or hands, such as a touch panel sheet or a touch panel display of an apparatus such as a mobile phone (e.g. a smartphone), a personal digital assistant, a gaming machine or a remote controller (for example, glass or film to be used for e.g. display portion, or glass or film to be used This application is a continuation of PCT Application No. PCT/JP2019/050412, filed on Dec. 23, 2019, which is based upon and claims the benefit of priority from Japanese Patent Application No. 2018-242730 filed on Dec. 26, 2018. The contents of those applications are incorporated herein by reference in their entireties.

REFERENCE SYMBOLS

10: Water/oil repellent layer-provided substrate
12: Substrate
14: Undercoat layer
16: Water/oil repellent layer

What is claimed is:

1. A water/oil repellent layer-provided substrate, comprising:
   a substrate;
   an undercoat layer formed on A surface of the substrate; and
   a water/oil repellent layer formed on a surface of the undercoat layer in this order,
   wherein the water/oil repellent layer comprises a condensate of a fluorinated compound having a reactive silyl group, the undercoat layer contains an oxide containing silicon and contains no alkali metal nor aluminum, the substrate comprises silica glass containing an alkali metal and aluminum, and
   when the following (a), (b) and (c) are specified from a depth profile (measurement interval: 2.0 nm or shorter)

obtained by X-ray photoelectron spectroscopy (XPS) by $C_{60}$ ion sputtering from a surface of the water/oil repellent layer, taking a total concentration of fluorine, silicon, aluminum, the alkali metal element and oxygen as 100 at %, an alkali deficiency index determined by the following (c) is higher than 0.0; provided that a depth indicated by a horizontal axis of the depth profile is a depth calculated from a sputtering rate of a thermally oxidized film having a known thickness on a silicon wafer:

(a): in the depth profile taking the total concentration of fluorine, silicon, aluminum, the alkali metal element and oxygen as 100 at %, obtained by XPS, a point at which a fluorine concentration becomes 10 at % or lower for a first time is taken as a boundary between the water/oil repellent layer and the undercoat layer;

(b): from the depth profile taking the total concentration of fluorine, silicon, aluminum, the alkali metal element and oxygen as 100 at %, obtained by XPS, a proportion of aluminum to silicon (Al/Si) and a total proportion of the alkali metal element to silicon (alkali metal element/Si) are obtained, and based on average values of values of (Al/Si) and values of (alkali metal element/Si) in a region at a depth of at least 70.0 nm and at most 80.0 nm respectively being 1, the (Al/Si) and (alkali metal element/Si) at respective positions in a depth direction are respectively normalized, and a point at which the normalized (Al/Si) value becomes 0.50 or higher for a first time is taken as a boundary between the undercoat layer and the substrate;

(c): a region from the boundary between the undercoat layer and the substrate determined by (b) as an origin up to 20 nm in the depth direction from the origin is taken as a region X, and the alkali deficiency index in the region X defined by the following formula is obtained:

alkali deficiency index=[(average value of normalized Al/Si in the region X)−(average value of normalized alkali metal element/Si in the region X)]×20.

2. The water/oil repellent layer-provided substrate according to claim 1, wherein the alkali deficiency index is higher than 0.5.

3. The water/oil repellent layer-provided substrate according to claim 1, wherein the substrate is made of chemically tempered glass having chemical tempering treatment applied to at least one surface, and the undercoat layer is formed on the surface having chemical tempering treatment applied thereto.

4. The water/oil repellent layer-provided substrate according to claim 1, wherein the average fluorine concentration which is the average value of the fluorine concentrations in the water/oil repellent layer specified by (a) is at least 15 at %.

5. The water/oil repellent layer-provided substrate according to claim 1, wherein the thickness of the undercoat layer specified by (a) and (b) is from 1.0 to 45.0 nm.

6. The water/oil repellent layer-provided substrate according to claim 1, wherein the thickness of the undercoat layer specified by (a) and (b) is from 7.0 to 25.0 nm.

7. The water/oil repellent layer-provided substrate according to claim 1, wherein the thickness of the substrate is from 0.1 to 1.5 mm.

8. The water/oil repellent layer-provided substrate according to claim 1, wherein the fluorinated compound is a fluorinated compound having two or more reactive silyl groups.

9. The water/oil repellent layer-provided substrate according to claim 1, wherein the fluorinated compound is a fluorinated ether compound having a poly(oxyfluoroalkylene) chain and a reactive silyl group.

10. The water/oil repellent layer-provided substrate according to claim 9, wherein in the poly(oxyfluoroalkylene) chain a proportion of a number of units of a oxyperfluoroalkylene group to a total number of units is from 50 to 100%.

11. A method for producing the water/oil repellent layer-provided substrate as defined in claim 1, which comprises forming, on the surface of the substrate, the undercoat layer containing an oxide containing silicon and an alkali metal, forming, on the surface of the undercoat layer, the water/oil repellent layer comprising a condensate of a fluorinated compound having a reactive silyl group, and
subjecting the water/oil repellent layer-formed side to an aqueous medium treatment.

12. The method for producing the water/oil repellent layer-provided substrate according to claim 11, wherein the aqueous medium treatment is washing treatment with an aqueous acid solution or dipping treatment in an aqueous acid solution.

13. The water/oil repellent layer-provided substrate according to claim 2, wherein the substrate is made of chemically tempered glass having chemical tempering treatment applied to at least one surface, and the undercoat layer is formed on the surface having chemical tempering treatment applied thereto.

14. The water/oil repellent layer-provided substrate according to claim 2, wherein the average fluorine concentration which is the average value of the fluorine concentrations in the water/oil repellent layer specified by (a) is at least 15 at %.

15. The water/oil repellent layer-provided substrate according to claim 2, wherein the thickness of the undercoat layer specified by (a) and (b) is from 1.0 to 45.0 nm.

16. The water/oil repellent layer-provided substrate according to claim 2, wherein the thickness of the undercoat layer specified by (a) and (b) is from 7.0 to 25.0 nm.

17. The water/oil repellent layer-provided substrate according to claim 2, wherein the thickness of the substrate is from 0.1 to 1.5 mm.

18. The water/oil repellent layer-provided substrate according to claim 2, wherein the fluorinated compound is a fluorinated compound having two or more reactive silyl groups.

19. The water/oil repellent layer-provided substrate according to claim 2, wherein the fluorinated compound is a fluorinated ether compound having a poly(oxyfluoroalkylene) chain and a reactive silyl group.

20. The water/oil repellent layer-provided substrate according to claim 19, wherein in the poly(oxyfluoroalkylene) chain a proportion of a number of units of a oxyperfluoroalkylene group to a total number of units is from 50 to 100%.

* * * * *